(12) United States Patent
Kim et al.

(10) Patent No.: US 11,792,976 B2
(45) Date of Patent: Oct. 17, 2023

(54) SEMICONDUCTOR MEMORY DEVICE

(71) Applicant: Samsung Electronics Co., Ltd., Suwon-si (KR)

(72) Inventors: Dongoh Kim, Daegu (KR); Gyuhyun Kil, Hwaseong-si (KR); Junghoon Han, Hwaseong-si (KR); Doosan Back, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

(21) Appl. No.: 17/371,558

(22) Filed: Jul. 9, 2021

(65) Prior Publication Data

US 2022/0189967 A1 Jun. 16, 2022

(30) Foreign Application Priority Data

Dec. 10, 2020 (KR) ........................ 10-2020-0172575

(51) Int. Cl.
*H10B 12/00* (2023.01)

(52) U.S. Cl.
CPC ......... *H10B 12/50* (2023.02); *H10B 12/0335* (2023.02); *H10B 12/053* (2023.02); *H10B 12/09* (2023.02); *H10B 12/315* (2023.02); *H10B 12/34* (2023.02); *H10B 12/482* (2023.02); *H10B 12/485* (2023.02)

(58) Field of Classification Search
CPC ........ H01L 27/10897; H01L 27/10814; H01L 27/10823; H01L 27/10855; H01L 27/10876; H01L 27/10885; H01L 27/10888; H01L 27/10894; H01L 27/10805; H01L 27/1085; H10B 12/50; H10B 12/09
See application file for complete search history.

(56) References Cited

U.S. PATENT DOCUMENTS

| | | | |
|---|---|---|---|
| 7,928,504 B2 | 4/2011 | Choi | |
| 8,309,460 B2 | 11/2012 | Kim et al. | |
| 9,478,551 B2 | 10/2016 | Kim et al. | |
| 9,842,841 B2 | 12/2017 | Kim et al. | |
| 9,960,170 B1 | 5/2018 | Kim et al. | |
| 2016/0163708 A1 | 6/2016 | Jang et al. | |
| 2018/0076205 A1* | 3/2018 | Li | H10B 12/09 |
| 2018/0175045 A1* | 6/2018 | Lee | H01L 23/528 |
| 2018/0358364 A1* | 12/2018 | Nagai | H10B 12/50 |

FOREIGN PATENT DOCUMENTS

| | | | | |
|---|---|---|---|---|
| CN | 111710678 A | * | 9/2020 | ....... H01L 27/10805 |
| KR | 2003/0088627 A | | 11/2003 | |

* cited by examiner

*Primary Examiner* — Edward Chin
(74) *Attorney, Agent, or Firm* — Harness, Dickey & Pierce, P.L.C.

(57) ABSTRACT

A semiconductor memory device may have a substrate including an active region in a memory cell region and a logic active region in a peripheral region, an element isolation structure between the active region and the logic active region, an insulating layer pattern covering the active region, and a support insulating layer. The insulating layer pattern may include an extension portion that extends along the element isolation structure, may be spaced apart from the element isolation structure, and may overhang over the element isolation structure. The support insulating layer may fill a recess space defined between the extension portion and the element isolation structure.

18 Claims, 28 Drawing Sheets

SEMICONDUCTOR MEMORY DEVICE

CROSS-REFERENCE TO RELATED APPLICATION

This application is based on and claims priority under 35 U.S.C. § 119 to Korean Patent Application No. 10-2020-0172575, filed on Dec. 10, 2020, in the Korean Intellectual Property Office, the disclosure of which is incorporated by reference herein in its entirety.

BACKGROUND

Inventive concepts relate to a semiconductor memory device, and more particularly, to a semiconductor memory device having a memory cell region and a peripheral region.

With the rapid development of the electronics industry and in order to meet the needs of users, electronic devices are becoming more compact and lighter. Accordingly, semiconductor memory devices used in electronic devices also may be required to be highly integrated, and the design rules for configurations of semiconductor memory devices may be reduced, resulting in a fine structure.

SUMMARY

Inventive concepts relate to a semiconductor memory device capable of securing reliability.

A semiconductor memory device according to an embodiment of inventive concepts may include a substrate including a memory cell region, an active region in the memory cell region, a peripheral region, and a logic active region in the peripheral region; an element isolation structure between the active region and the logic active region, the element isolation structure defining the active region and the logic active region; an insulating layer pattern covering the active region, the insulating layer pattern including an extension portion that extends along the element isolation structure, is spaced apart from the element isolation structure, and overhangs over the element isolation structure; and a support insulating layer filling a recess space defined between the extension portion and the element isolation structure.

A semiconductor memory device according to an embodiment of inventive concepts may include a substrate including a memory cell region, an active region in the memory cell region, a peripheral region, and a logic active region in the peripheral region; an element isolation structure between the active region and the logic active region, the element isolation structure defining the active region and the logic active region; an insulating layer pattern covering the active region, the insulating layer pattern having a stacked structure in which a second insulating layer pattern is on a first insulating layer pattern extending over the element isolation structure between the active region and the logic active region; and a support insulating layer between the insulating layer pattern and the element isolation structure. The first insulating layer pattern may include a first extension portion. The second insulating layer pattern may include a second extension portion. An extension length of the second extension portion may be greater than an extension length of the first extension portion. Each of the first extension portion and the second extension portion may extend along the element isolation structure, may be spaced apart from the element isolation structure, and may overhang over the element isolation structure. The support insulating layer may fill a recess space defined between the element isolation structure and a portion of the second extension portion extends over the element isolation structure from the first extension portion.

A semiconductor memory device according to an embodiment of inventive concepts may include a substrate including a memory cell region, a plurality of active regions in the memory cell region, a peripheral region, and a plurality of logic active regions in the peripheral region, where the substrate may define a plurality of word line trenches extending in parallel with each other in a horizontal direction across the plurality of active regions in the memory cell region; an element isolation structure between the plurality of active regions and the plurality of logic active regions and along between the memory cell region and the peripheral region, the element isolation structure defining the plurality of active regions and the plurality of logic active regions; a gate dielectric layer, a word line, and a buried insulating layer sequentially positioned in each of the plurality of word line trenches; an insulating layer pattern covering the plurality of active regions and the buried insulating layer, and the insulating layer extending over the element isolation structure between the memory cell region and the peripheral region, and the insulating layer pattern including a first insulating layer pattern and a second insulating layer pattern on the first insulating layer pattern; a transistor on the logic active region, the transistor including a gate insulating layer and a gate line on the gate insulating layer, the gate insulating layer having a stacked structure of a first gate insulating layer pattern having a first thickness and a second gate insulating layer pattern having a second thickness; and a support insulating layer between the insulating layer pattern and the element isolation structure. The first insulating layer pattern may include a first extension portion. The second insulating layer pattern may include a second extension portion. An extension length of the second extension portion may be greater than an extension length of the first extension portion. Each of the first extension portion and the second extension portion may extend along the element isolation structure from over the plurality of active regions and the buried insulating layer, may be spaced apart from the element isolation structure, and may overhang over the element isolation structure. The support insulating layer may fill a recess space defined between the element isolation structure and a portion of the second extension portion further extending from the first extension portion over the element isolation structure. A material in the support insulating layer may be the same material as a material in the first gate insulating layer pattern. The support insulating layer may have a third thickness that may be at least twice as large as the first thickness of the first gate insulating layer pattern.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
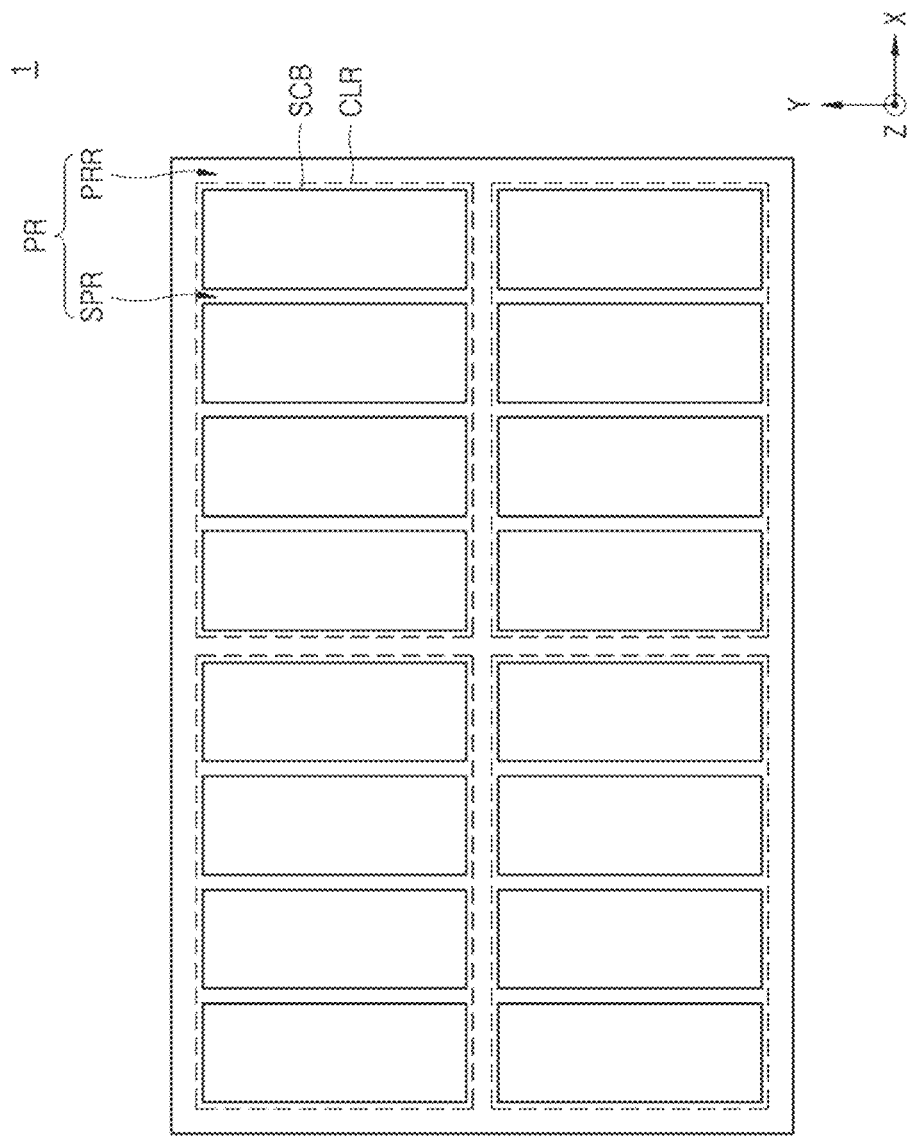
FIG. 1 is a block diagram illustrating a semiconductor memory device according to embodiments of inventive concepts.

FIG. 1 is a block diagram illustrating a semiconductor memory device according to embodiments of inventive concepts.

Referring to FIG. 1, a semiconductor memory device 1 may include a cell region CLR in which memory cells are arranged, and a main peripheral region PRR surrounding the cell region CLR.

According to an embodiment of inventive concepts, the cell region CLR may include sub-peripheral regions SPR that divide the cell blocks SCB. A plurality of memory cells may be arranged in the cell blocks SCB. In the present specification, the cell block SCB refers to a region in which the memory cells have a uniform spacing and are regularly arranged, and the cell block SCB may be referred to as a sub cell block.

Logic cells for input/output of electrical signals to or from memory cells may be arranged in the main peripheral region PRR and the sub peripheral region SPR. In some embodiments, the main peripheral region PRR may be referred to as a peripheral circuit region, and the sub peripheral region SPR may be referred to as a core circuit region. A peripheral region PR may include the main peripheral region PRR and the sub peripheral regions SPR. That is, the peripheral region PR may be a core and peripheral circuit region including the peripheral circuit region and the core circuit region. In some embodiments, at least a portion of the sub-peripheral region SPR may be provided only as a space for separating the cell blocks SCB.

Figure 2:
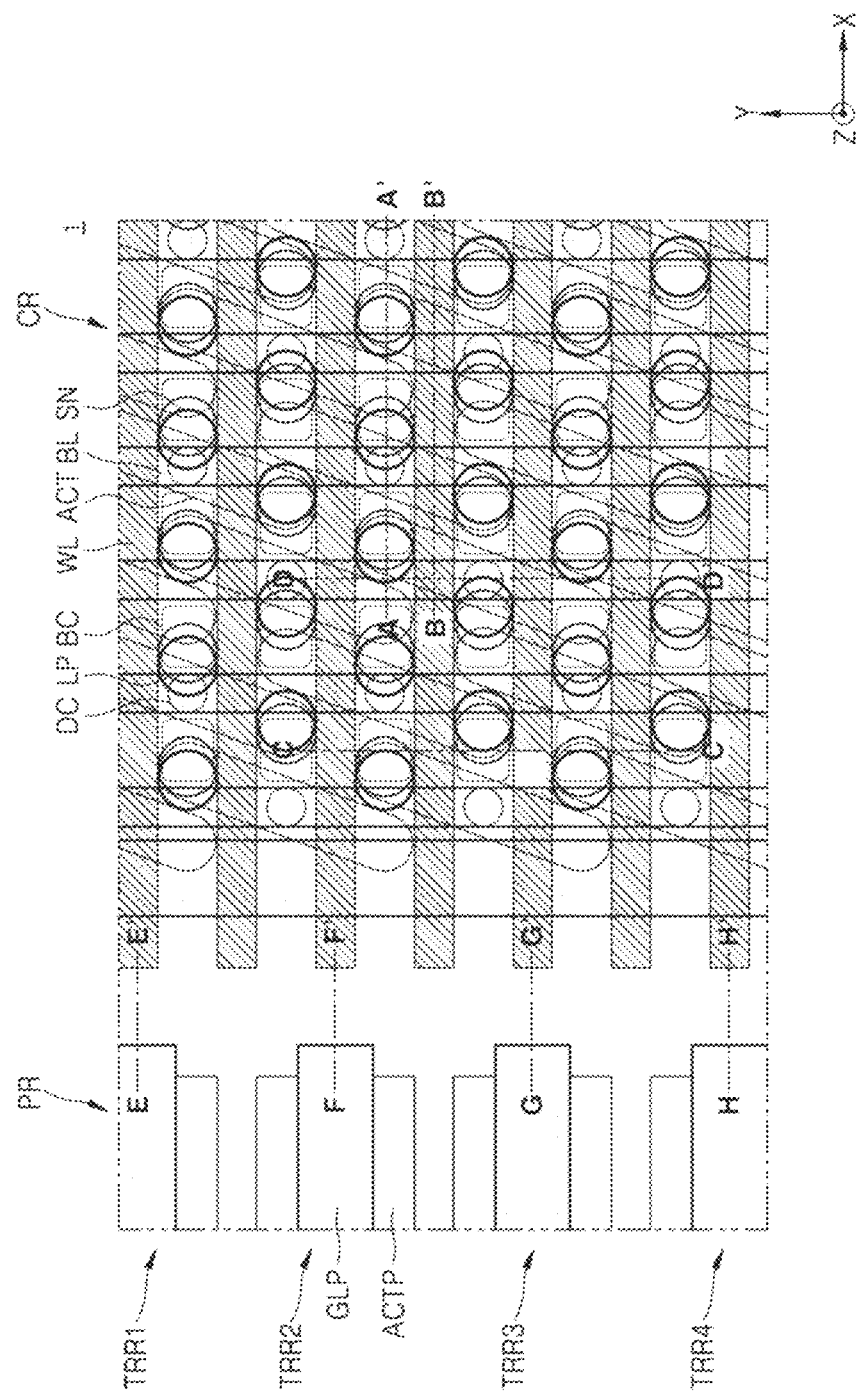
FIG. 2 is a schematic plan layout of main components of a semiconductor memory device according to embodiments of inventive concepts.

FIG. 2 is a schematic plan layout of main components of a semiconductor memory device according to example embodiments.

Referring to FIG. 2, a semiconductor memory device 1 includes a memory cell region CR and a peripheral region PR. The semiconductor memory device 1 may include a plurality of active regions ACTs formed in the memory cell region CR and a plurality of logic active regions ACTPs formed in the peripheral region PR. The memory cell region CR may be a cell block SCB in which a plurality of memory cells shown in FIG. 1 are arranged, and the peripheral region PR may include a main peripheral region PRR and sub peripheral regions SPR shown in FIG. 1.

In some embodiments, the plurality of active regions ACTs arranged in the memory cell region CR may be disposed to have long axes in a diagonal direction with respect to a first horizontal direction (X direction) and a second horizontal direction (Y direction).

A plurality of word lines WLs may extend parallel to each other in the first horizontal direction (X direction) across the plurality of active regions ACTs in the memory cell region CR. A plurality of bit lines BLs may extend parallel to each other in a second horizontal direction (Y direction) crossing the first horizontal direction (X direction) on the plurality of word lines WLs. The plurality of bit lines BLs may be connected to the plurality of active regions ACTs through direct contacts DCs.

In some embodiments, a plurality of buried contacts BCs may be formed between two adjacent bit lines BLs among the plurality of bit lines BLs. In some embodiments, the plurality of buried contacts BC may be arranged in a line in each of the first horizontal direction (X direction) and the second horizontal direction (Y direction).

A plurality of landing pads LPs may be respectively formed on the plurality of buried contacts BCs. The plurality of landing pads LPs may be arranged to at least partially overlap the plurality of buried contacts BCs. In some embodiments, the plurality of landing pads LPs may extend to an upper portion of any one of the two bit lines BLs adjacent to each other, respectively.

A plurality of storage nodes SNs may be formed on the plurality of landing pads LPs. The plurality of storage nodes SNs may be formed on the plurality of bit lines BLs. Each of the plurality of storage nodes SNs may be a lower electrode of a plurality of capacitors. The storage node SN may be connected to the active region ACT through the landing pad LP and the buried contact BC.

A plurality of gate line patterns GLPs may be arranged on the logic active regions ACTPs in the peripheral region PR. Referring to FIG. 2, the plurality of gate line patterns GLPs are shown to extend parallel to each other in the first horizontal direction (X direction) on the logic active region ACTPs and have a substantially constant width in the second horizontal direction (Y direction). However, the plurality of gate line patterns GLPs are not limited thereto. For example, each of the plurality of gate line patterns GLPs may have various widths or vary in width, and may have curvatures or extend in various directions.

Referring to FIG. 2, components other than the plurality of logic active regions ACTPs and the plurality of gate line patterns GLPs in the peripheral region PR are omitted for convenience of illustration. In some embodiments, at least some of the plurality of gate line patterns GLPs may extend outside the logic active region ACTP, that is, onto a logic element isolation layer 115 as shown in FIGS. 6E to 6H.

The plurality of gate line patterns GLPs may be formed at the same level as the plurality of bit lines BLs. In some embodiments, the plurality of gate line patterns GLPs are made of the same material as the plurality of bit lines BLs, or at least a portion thereof may be made of the same material as that of the plurality of bit lines BLs. For example, the process of forming all or part of the plurality of gate line patterns GLPs may be the same process as all or part of the process of forming the plurality of bit lines BLs.

A plurality of transistors including a first transistor TRR1, a second transistor TRR2, a third transistor TRR3, and a fourth transistor TRR4 may be arranged in the peripheral region PR. The first transistor TRR1, the second transistor TRR2, the third transistor TRR3, and the fourth transistor TRR4 are arranged in the peripheral region PR, and are some of a plurality of transistors constituting logic cells for input/output of electrical signals to or from memory cells.

The first transistor TRR1, the second transistor TRR2, the third transistor TRR3, and the fourth transistor TRR4 may be arranged along an edge of the memory cell region CR. FIG. 2 shows that the first transistor TRR1, the second transistor TRR2, the third transistor TRR3, and the fourth transistor TRR4 are sequentially arranged in the second horizontal direction (Y direction), but this is an example for convenience of illustration. The arrangement of the first transistor TRR1, the second transistor TRR2, the third transistor TRR3, and the fourth transistor TRR4 is not limited thereto, and each of the first transistor TRR1, the second transistor TRR2, the third transistor TRR3, and the fourth transistor TRR4 may be placed at any location around the memory cell region CR.

In some embodiments, the first transistor TRR1 and the second transistor TRR2 may have a relatively high operating voltage, and the third transistor TRR3 and the fourth transistor TRR4 may have a relatively low operating voltage. In some embodiments, the first and third transistors TRR1 and TRR3 may be nMOSFETs, and the second and fourth transistors TRR2 and TRR4 may be pMOSFETs.

FIGS. 3A to 3E, FIGS. 4A to 4H, and FIGS. 5A to 5E are cross-sectional views showing a method of manufacturing a semiconductor memory device according to embodiments of inventive concepts, and FIGS. 6A to 6H are cross-sectional views illustrating semiconductor memory devices according to embodiments of inventive concepts.

Figure 3A:
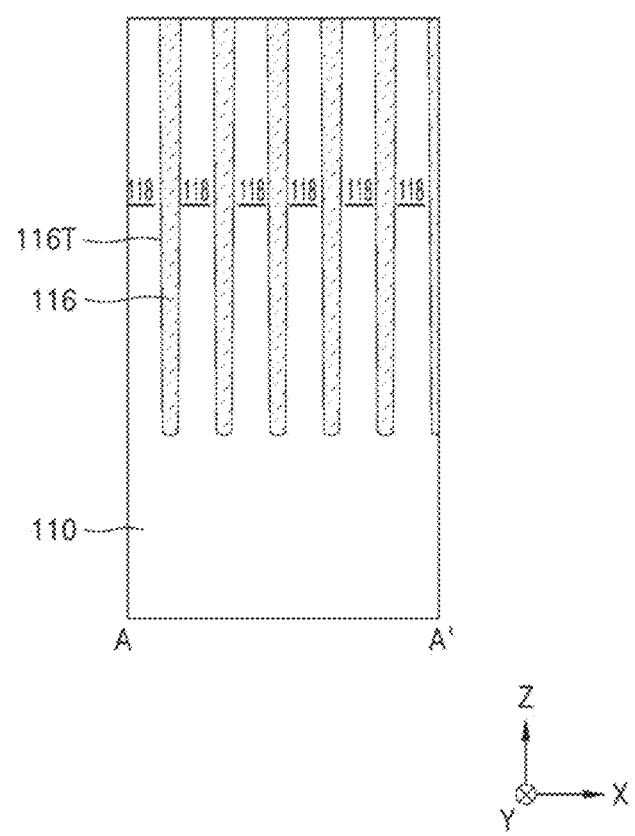
FIGS. 3A to 3E, FIGS. 4A to 4H, and FIGS. 5A to 5E are cross-sectional views showing a method of manufacturing a semiconductor memory device according to embodiments of inventive concepts.
Figure 3B:
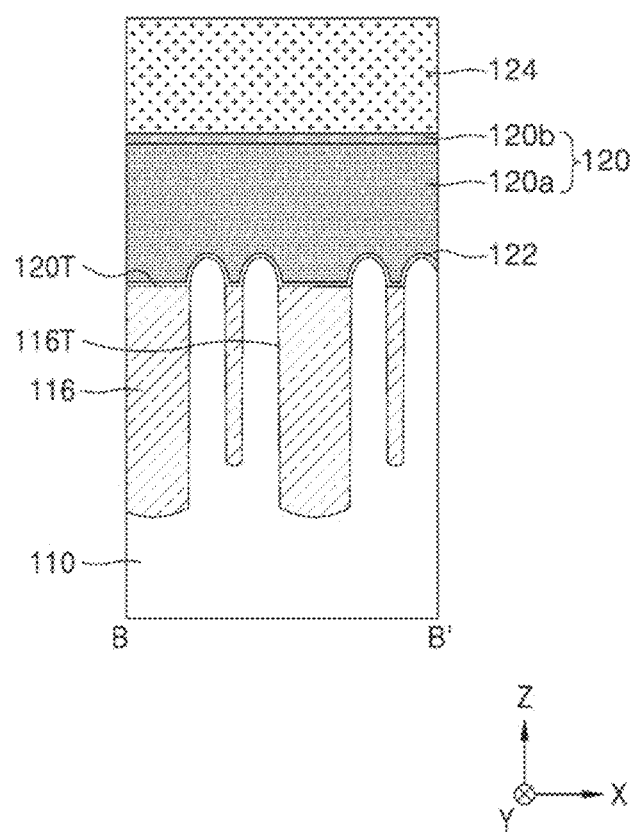
Figure 3C:
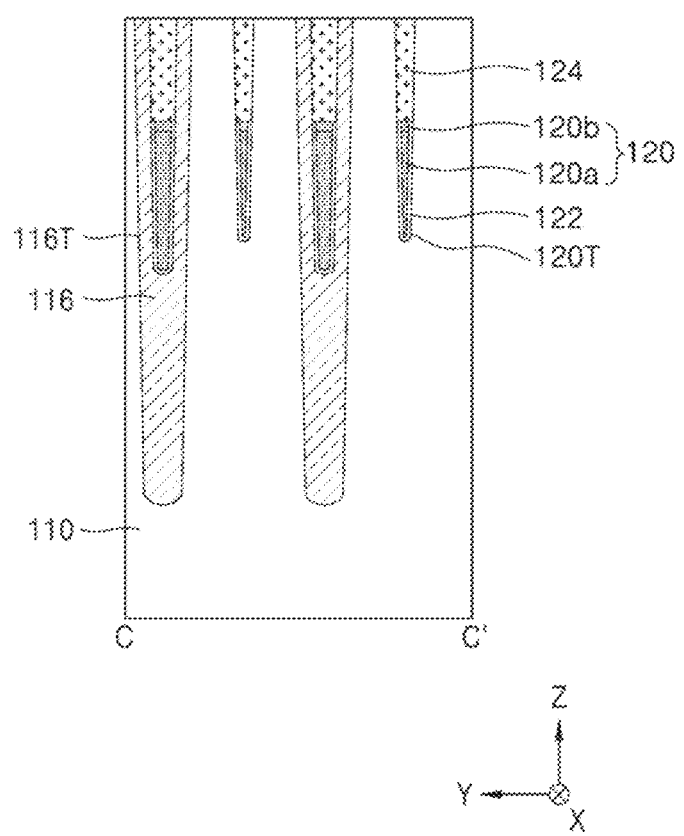
Figure 3D:
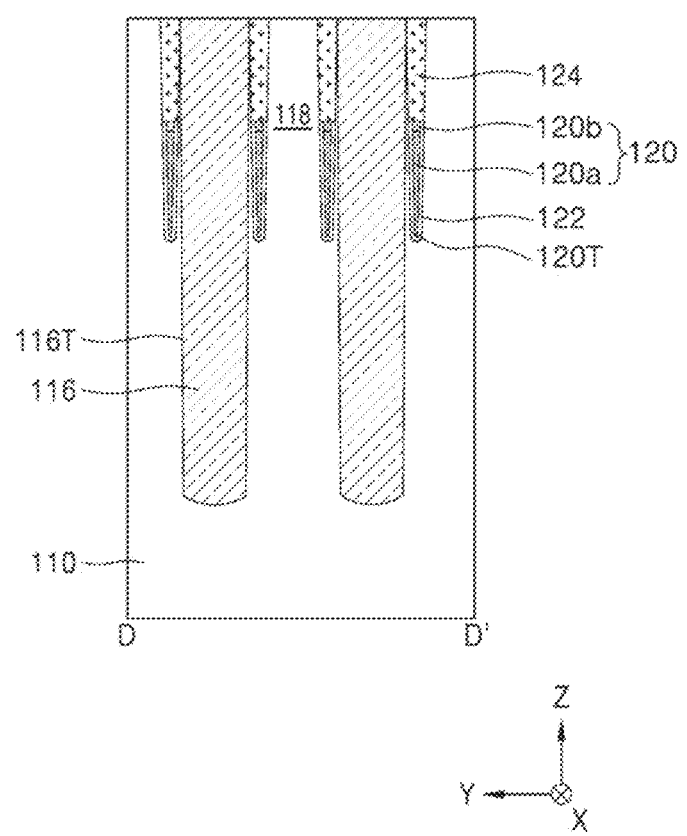
Figure 3E:
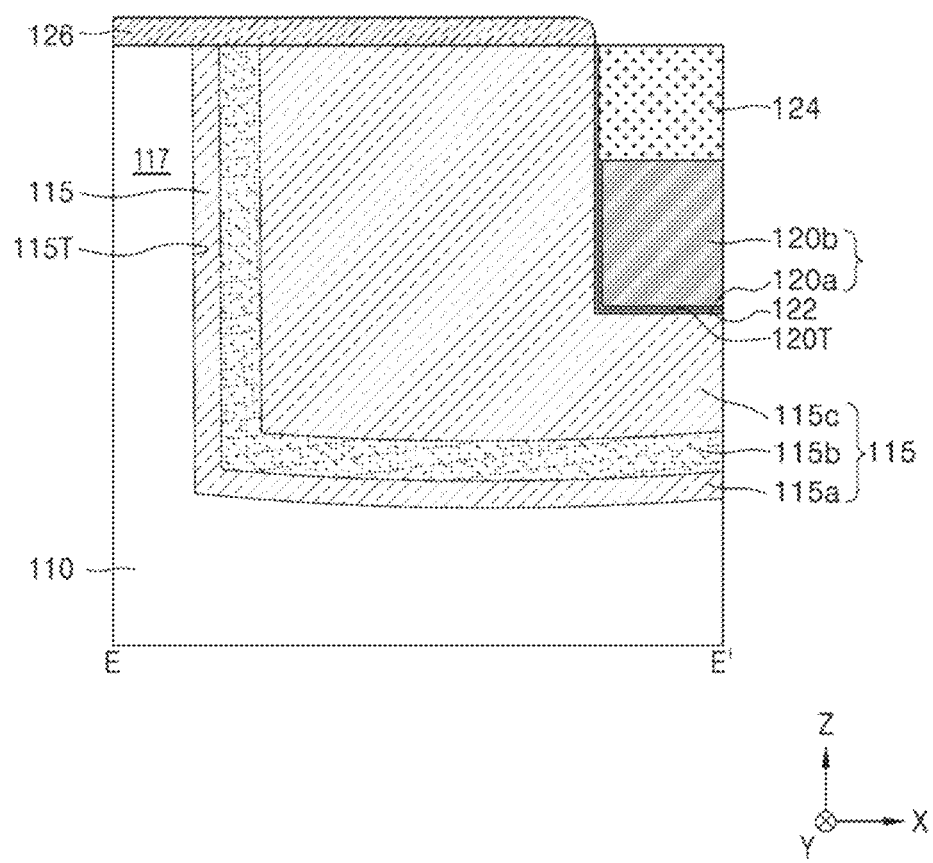
Figure 4A:
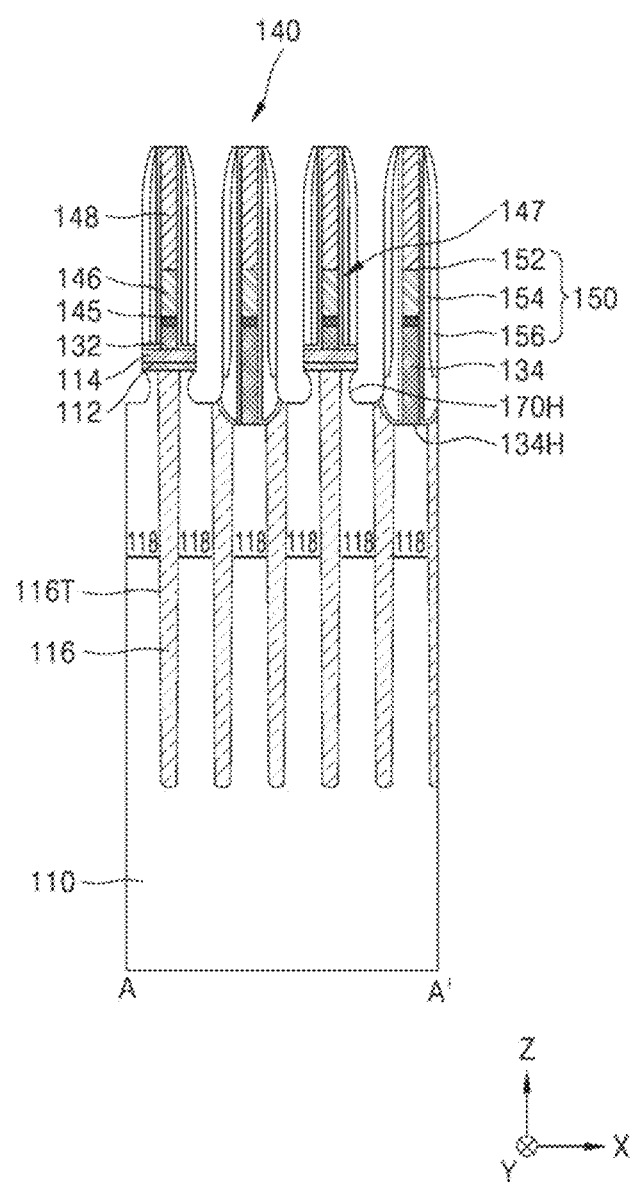
Figure 4B:
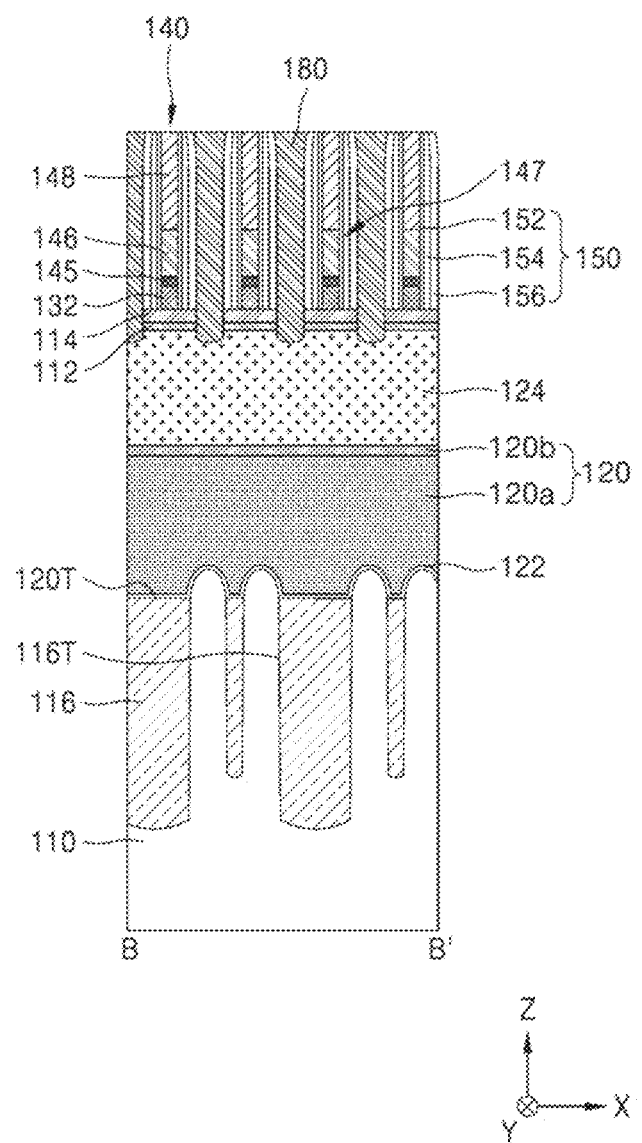
Figure 4C:
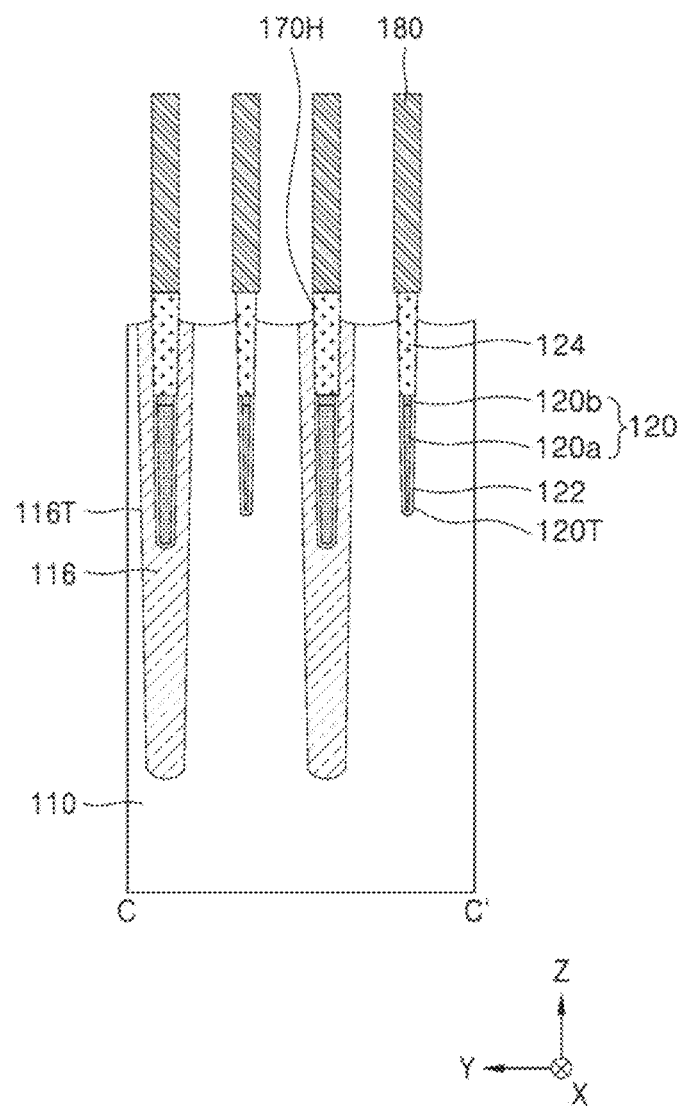
Figure 4D:
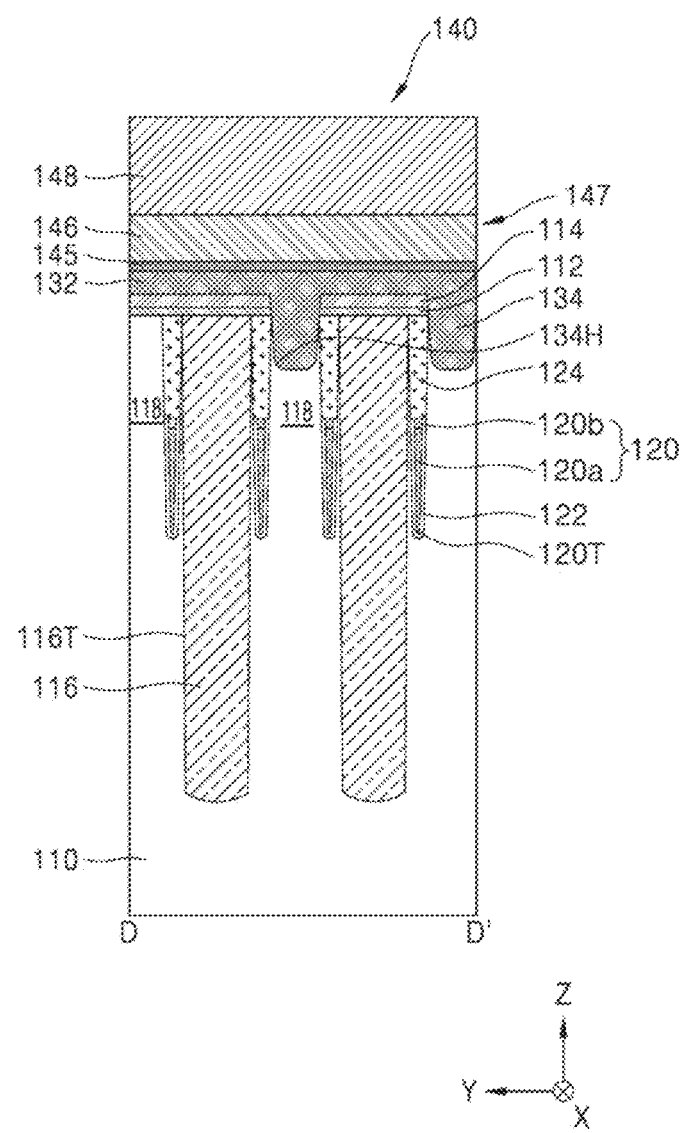
Figure 4E:
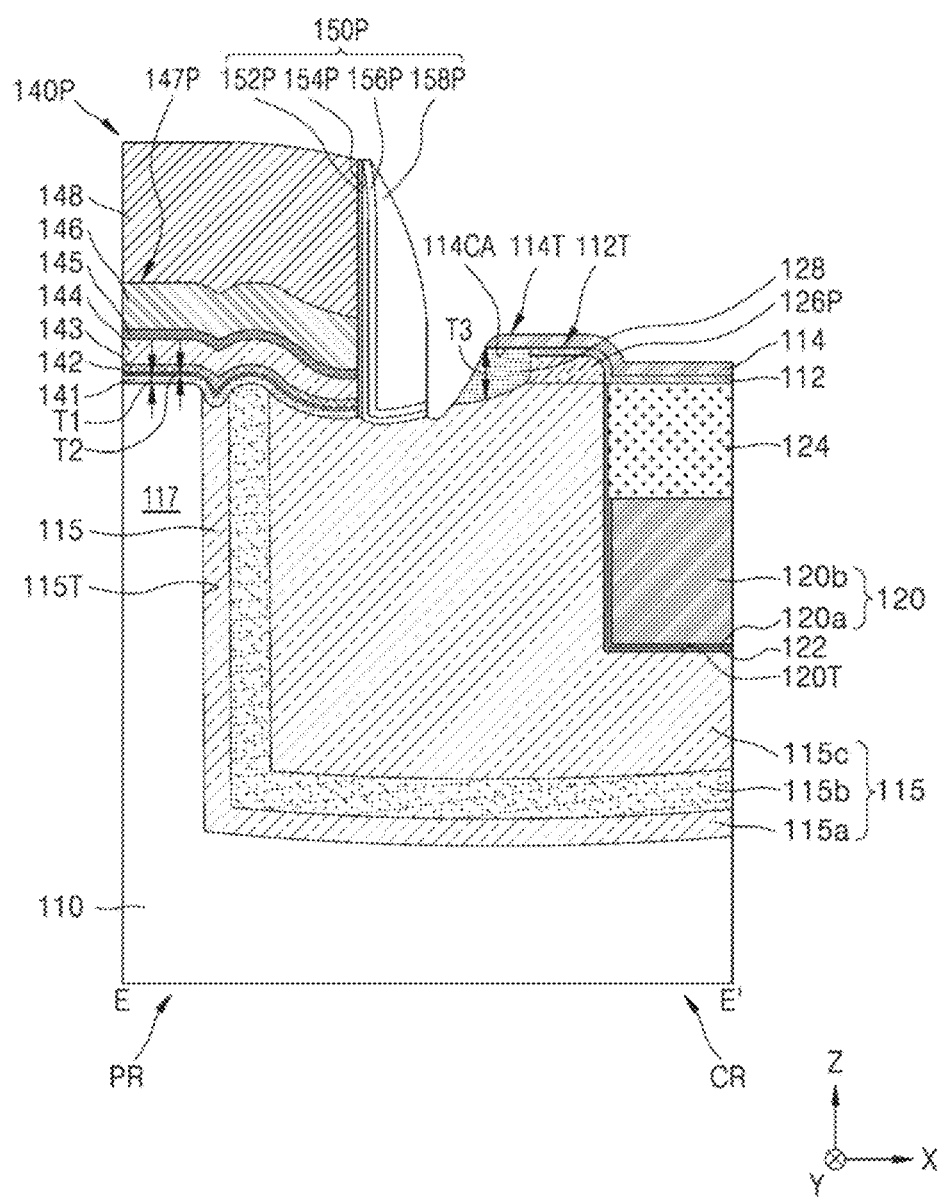
Figure 4F:
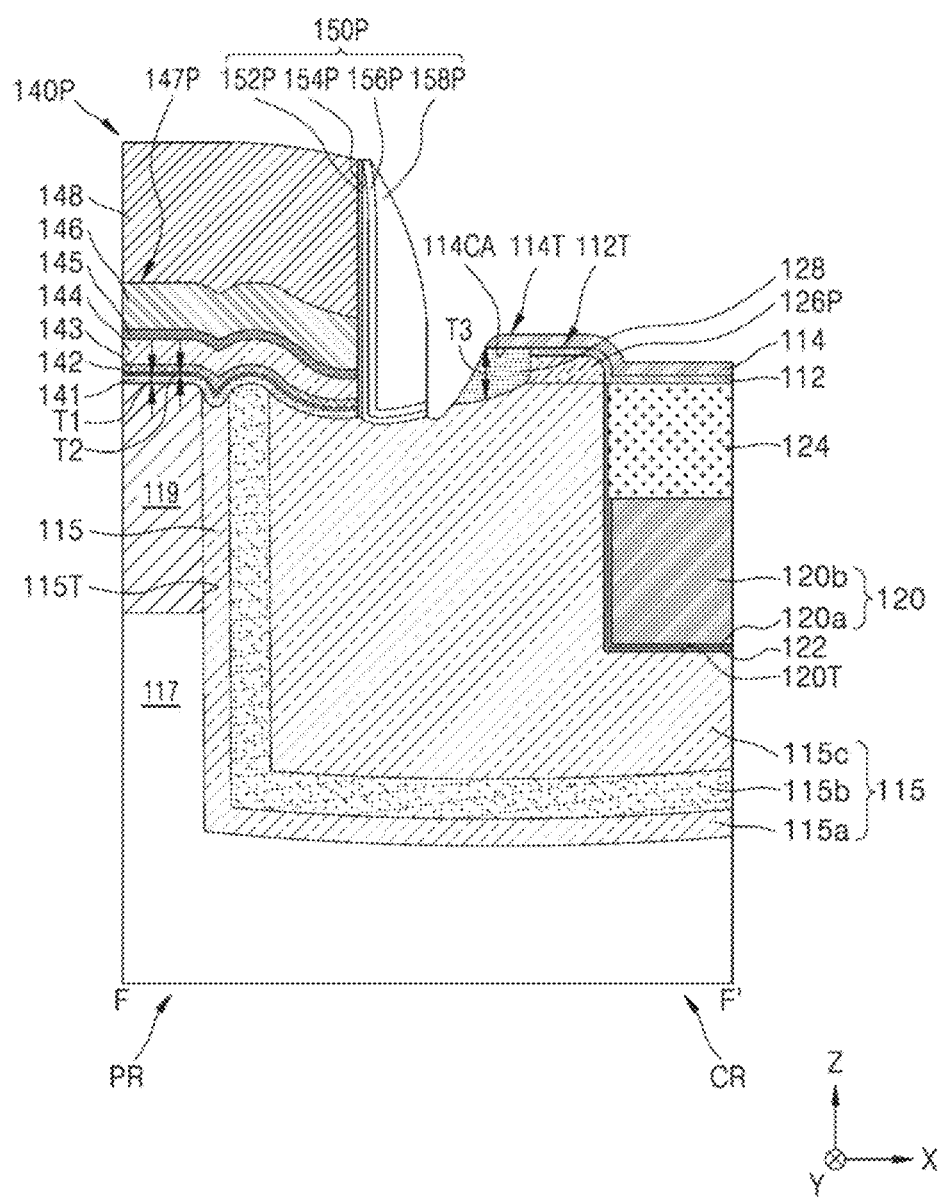
Figure 4G:
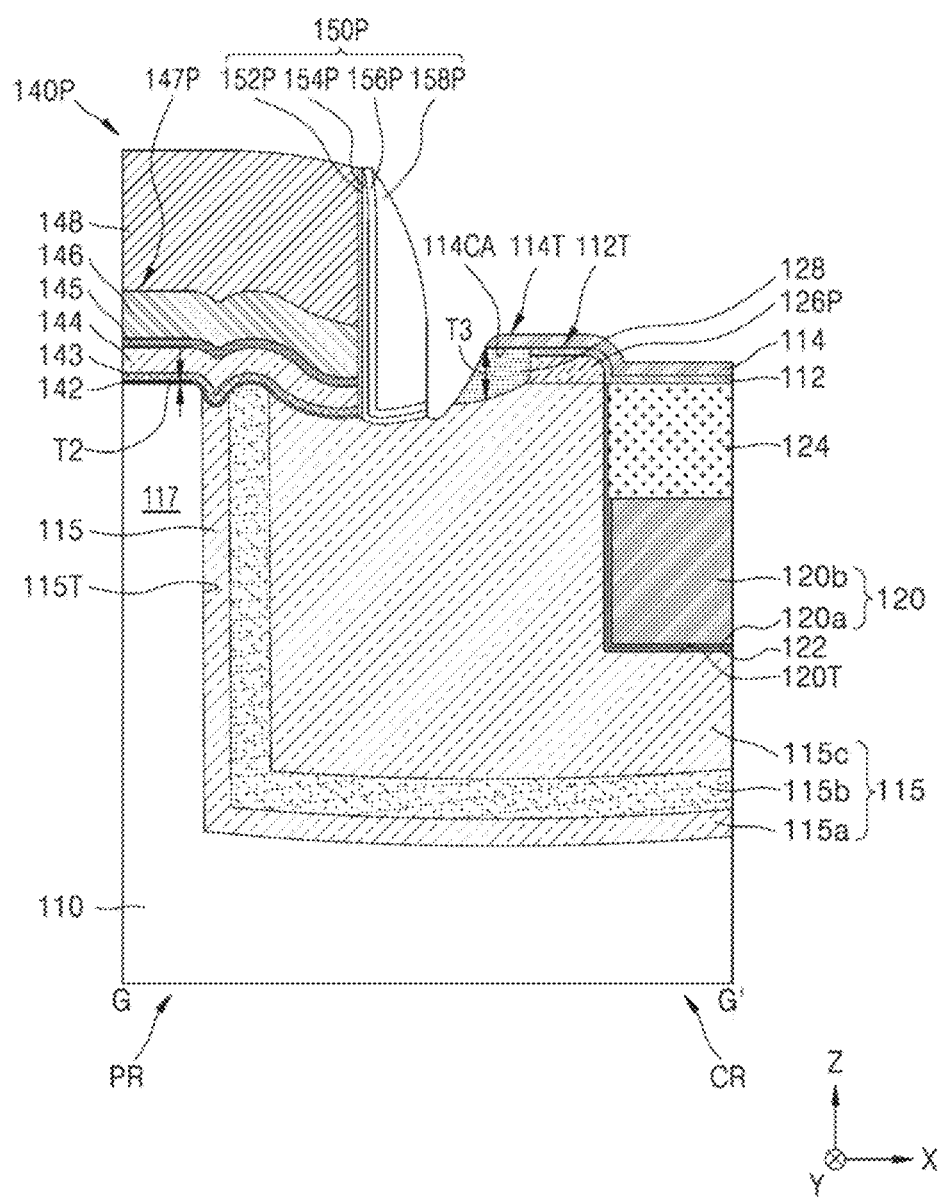
Figure 4H:
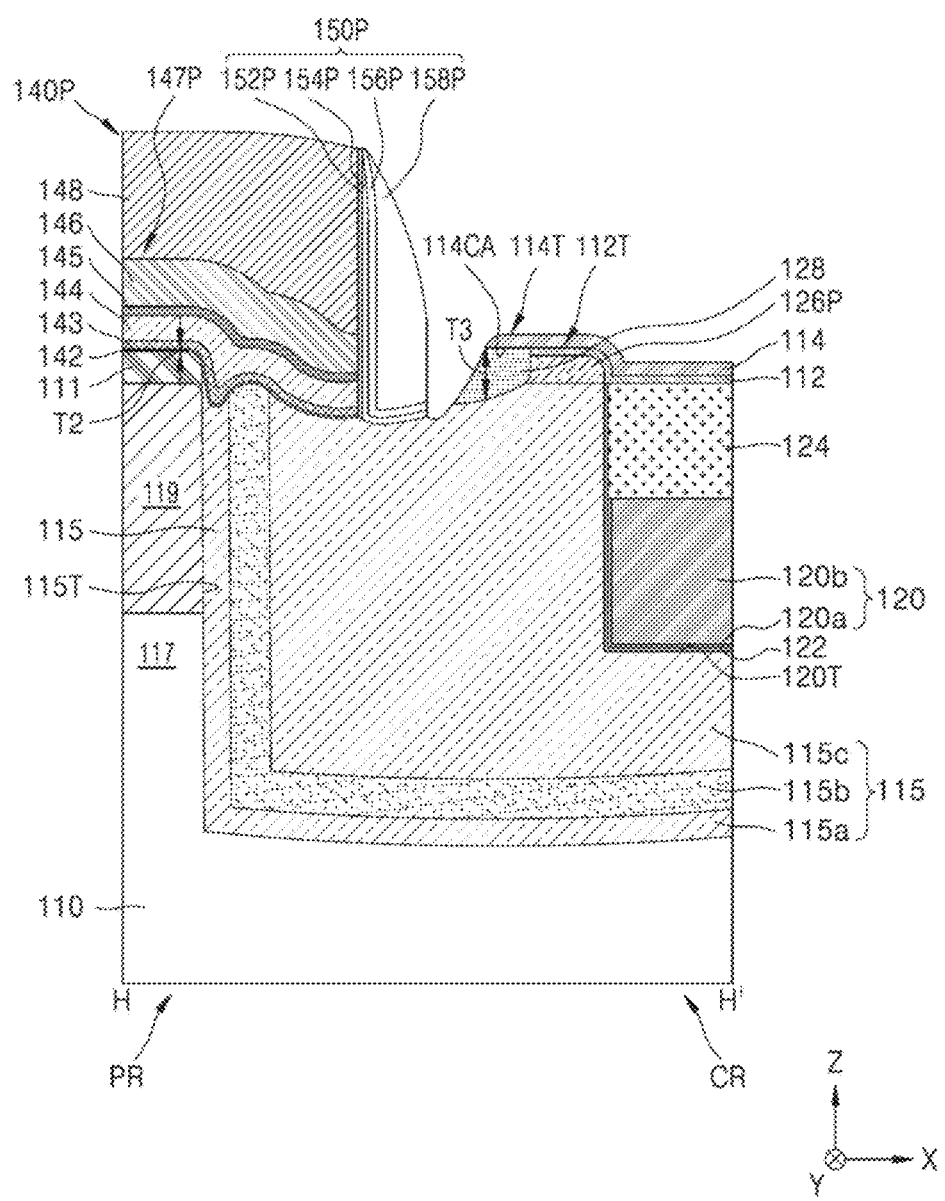
Figure 5A:
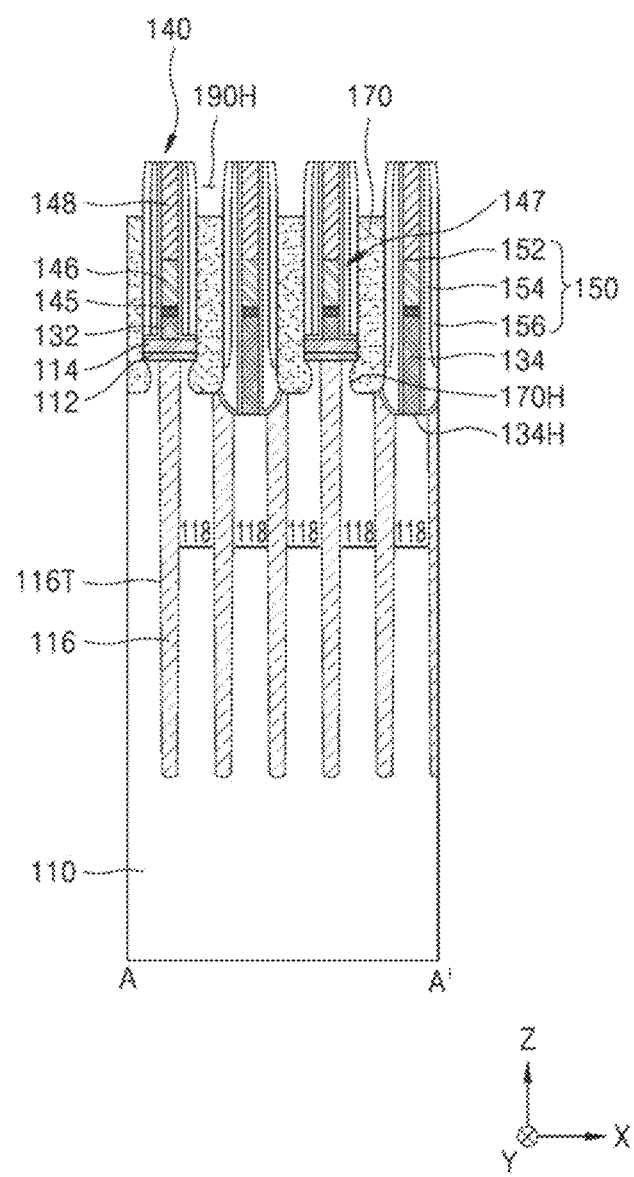
Figure 5B:
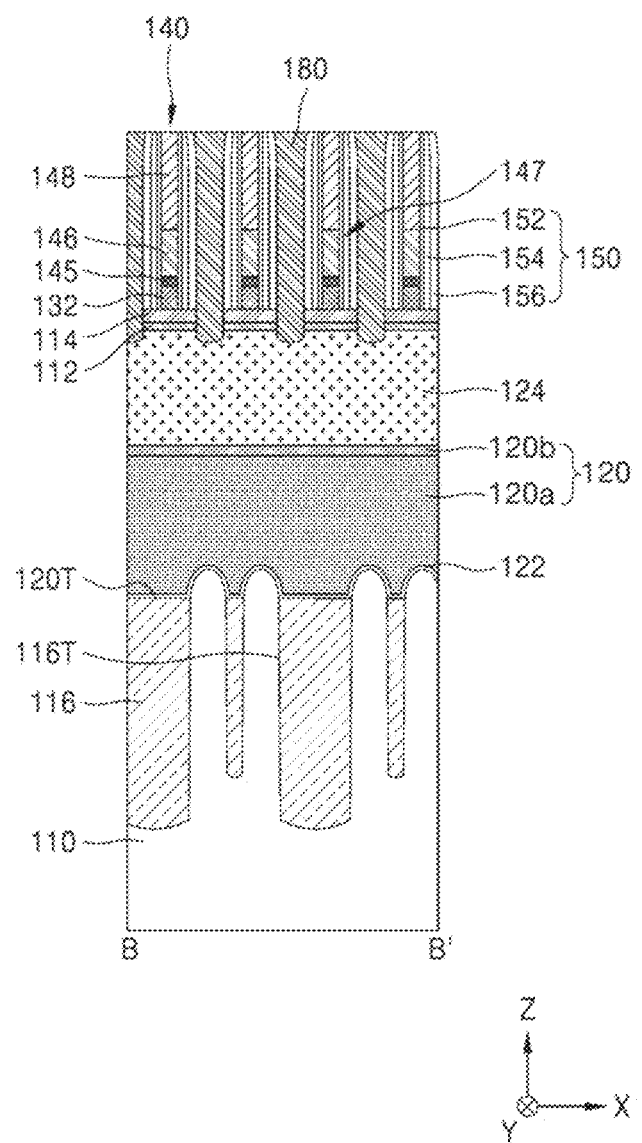
Figure 5C:
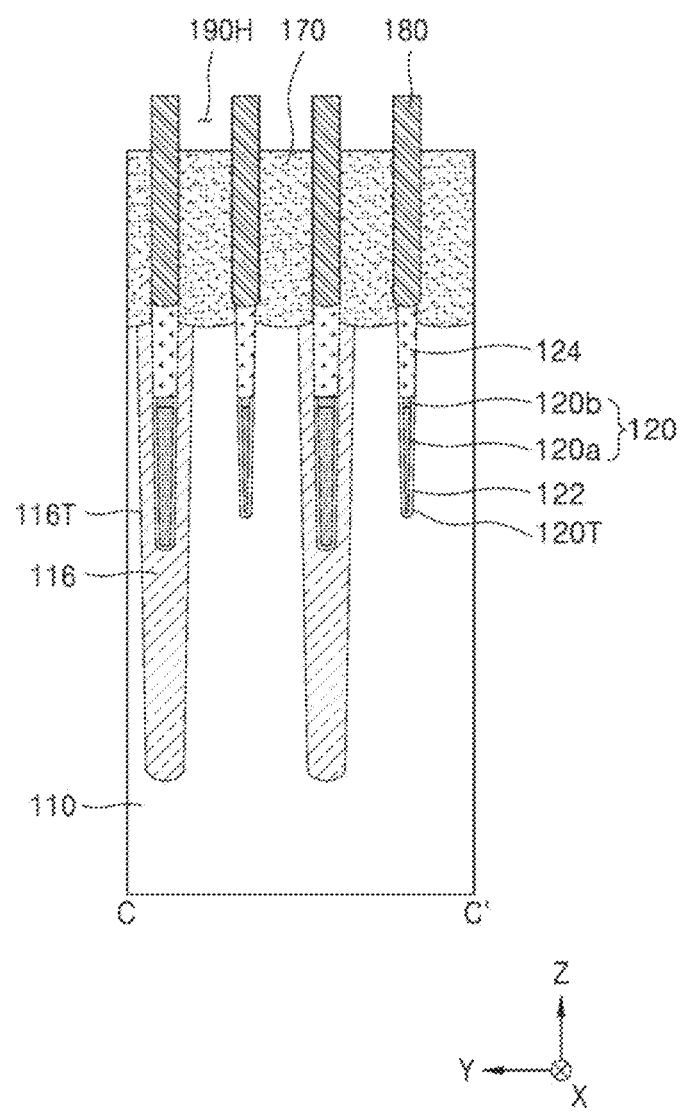
Figure 5D:
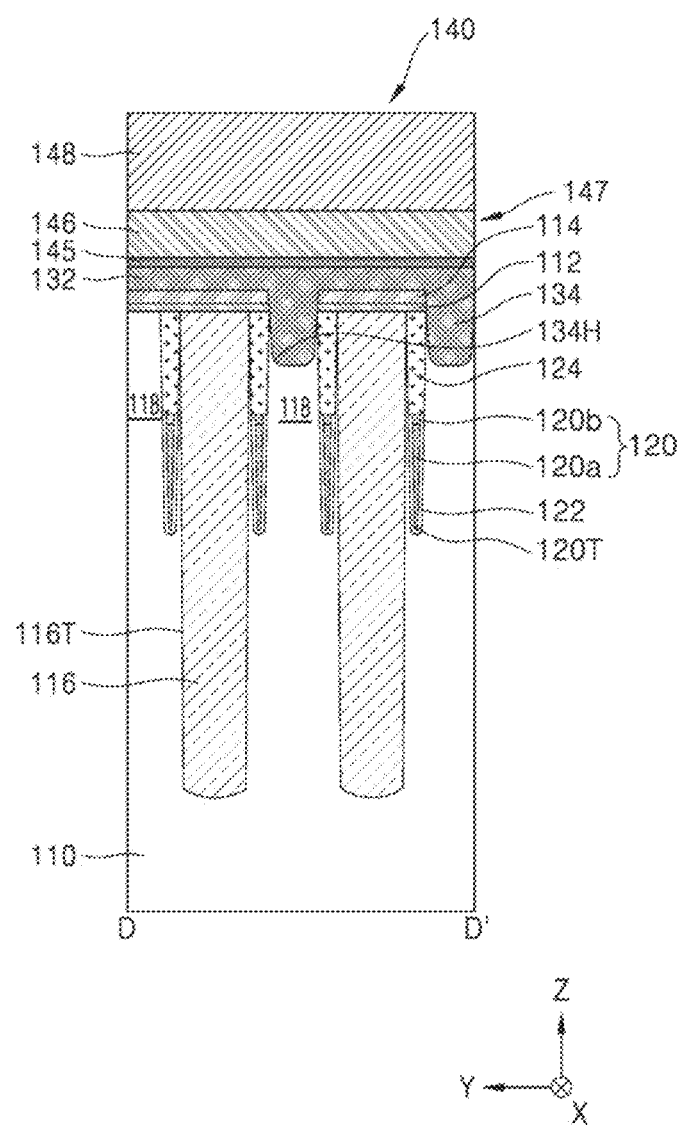
Figure 5E:
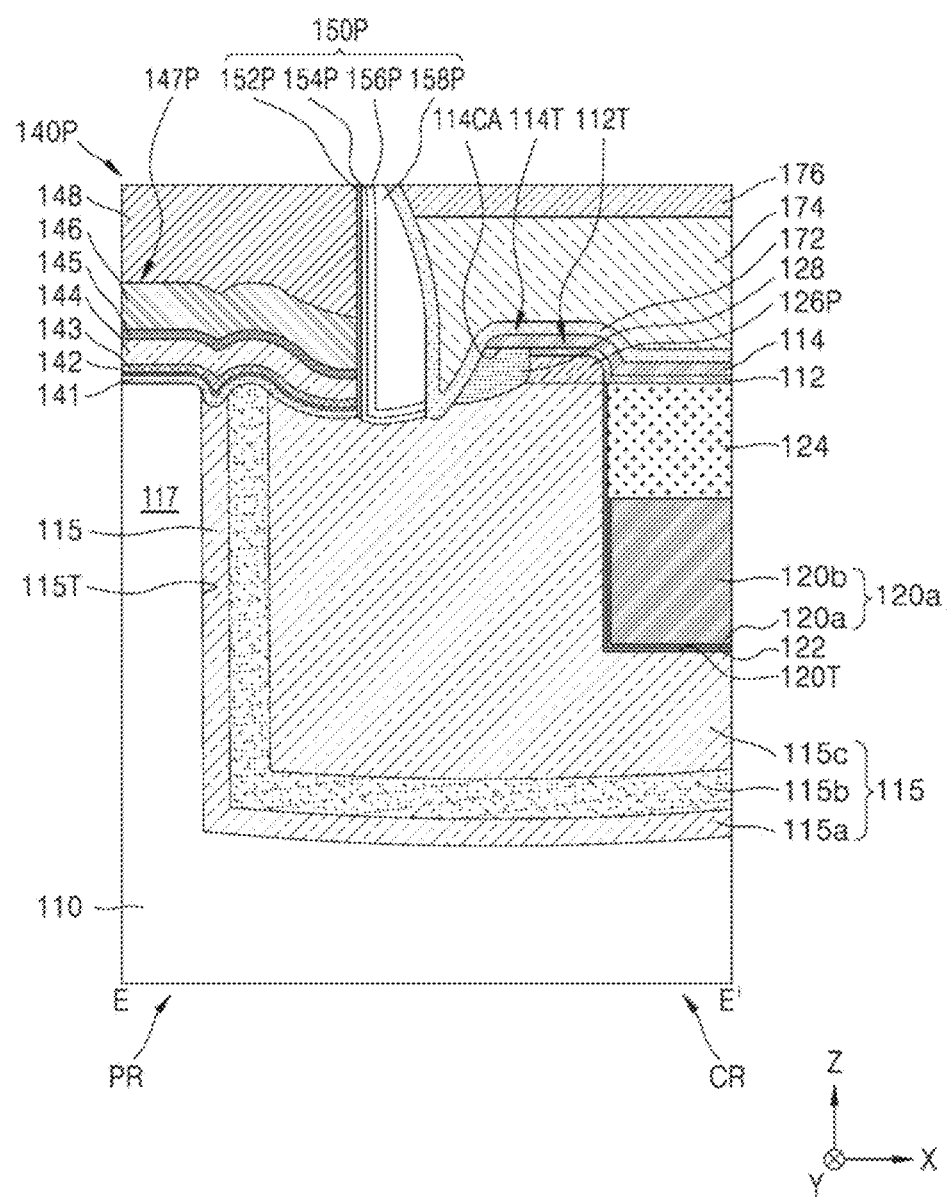
Figure 6A:
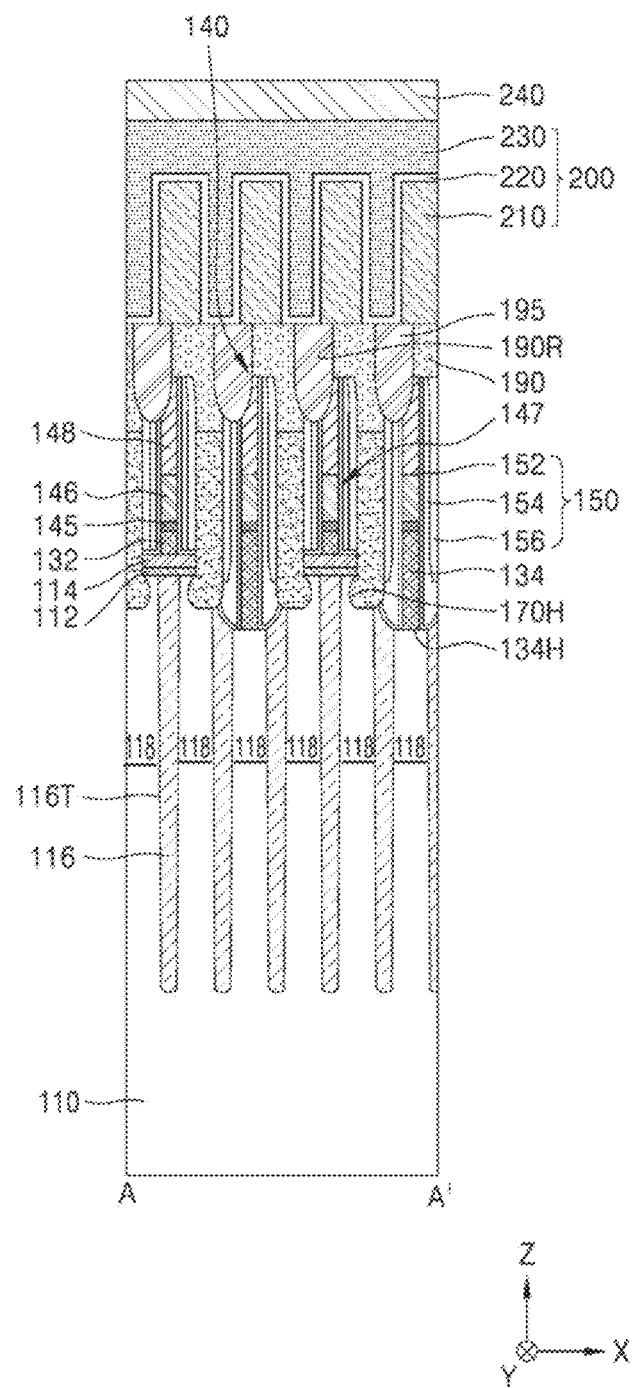
FIGS. 6A to 6H are cross-sectional views illustrating semiconductor memory devices according to embodiments of inventive concepts.
Figure 6B:
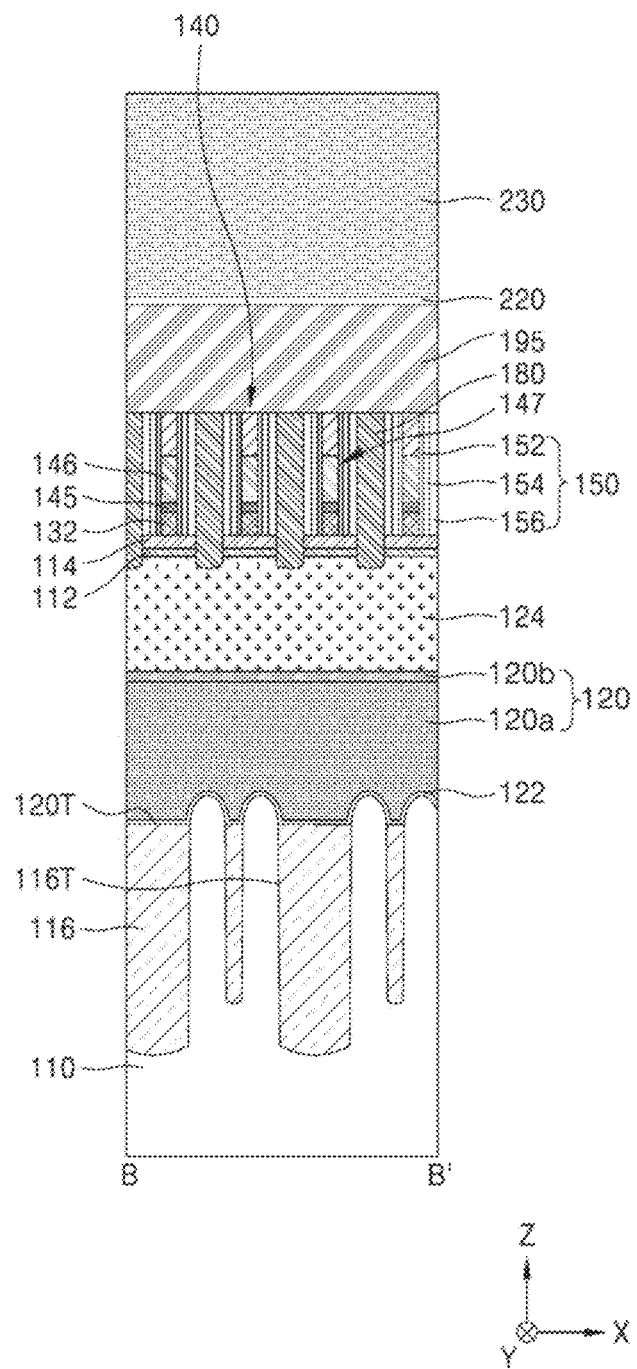
Figure 6C:
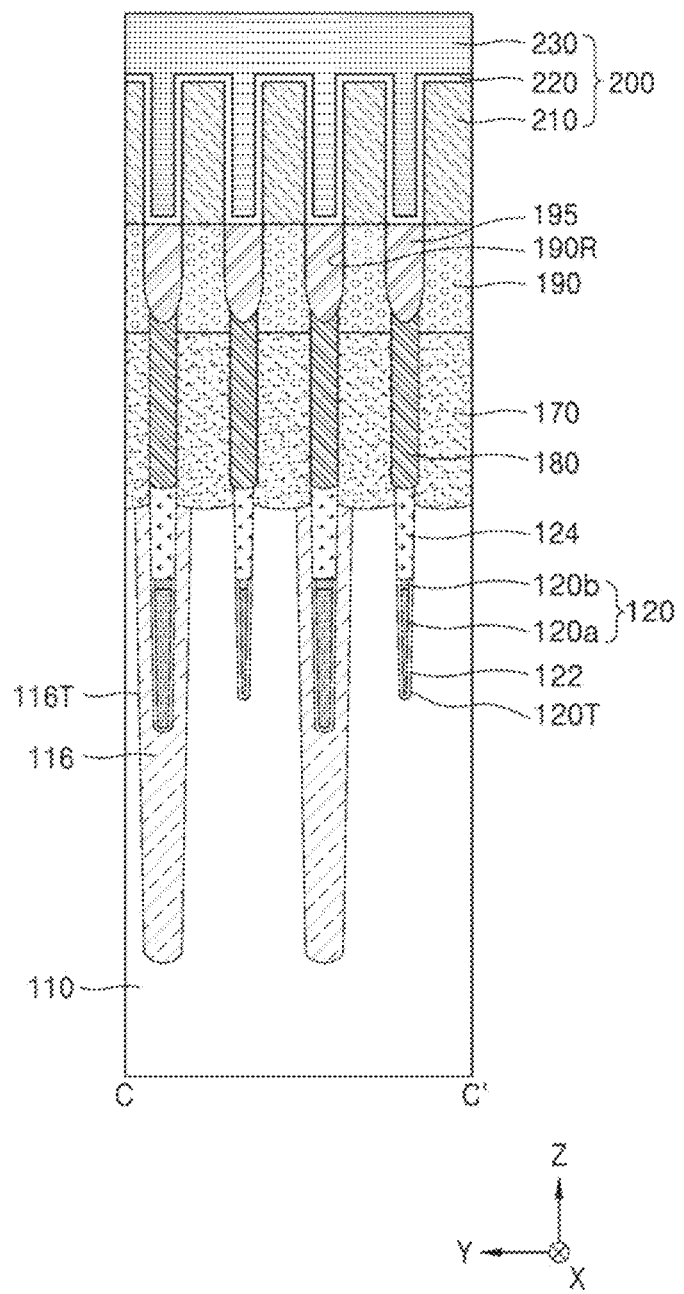
Figure 6D:
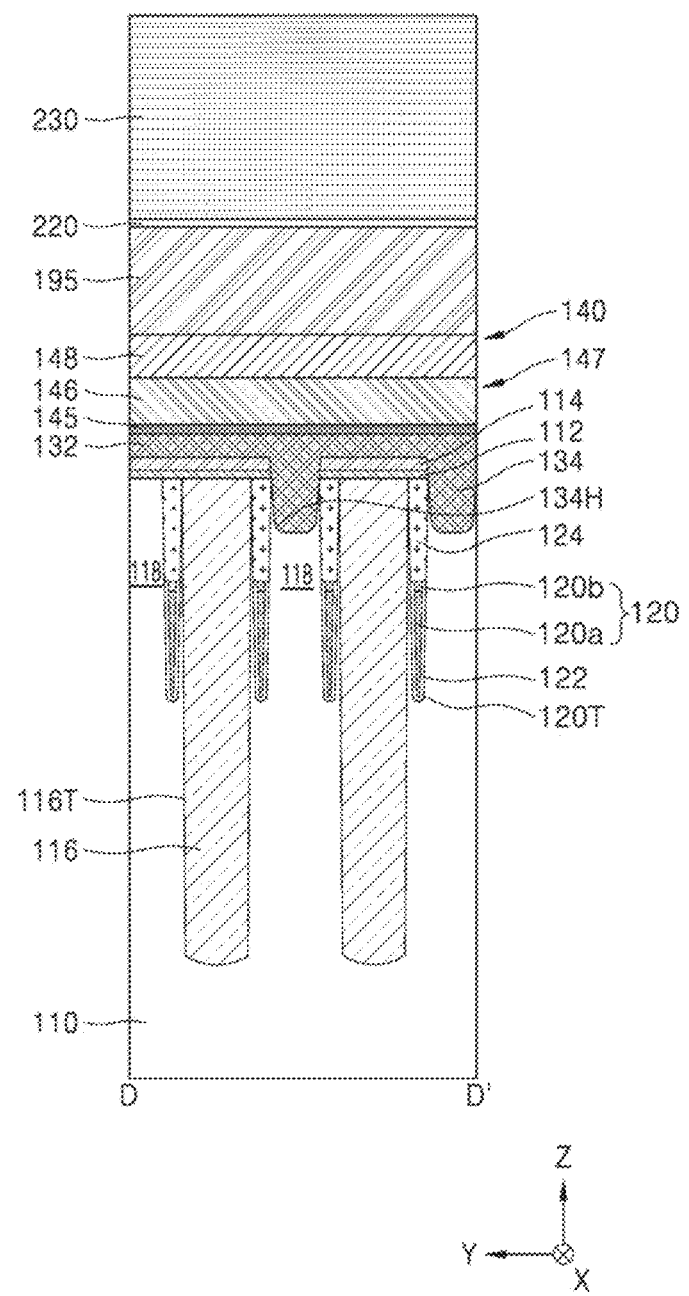
Figure 6E:
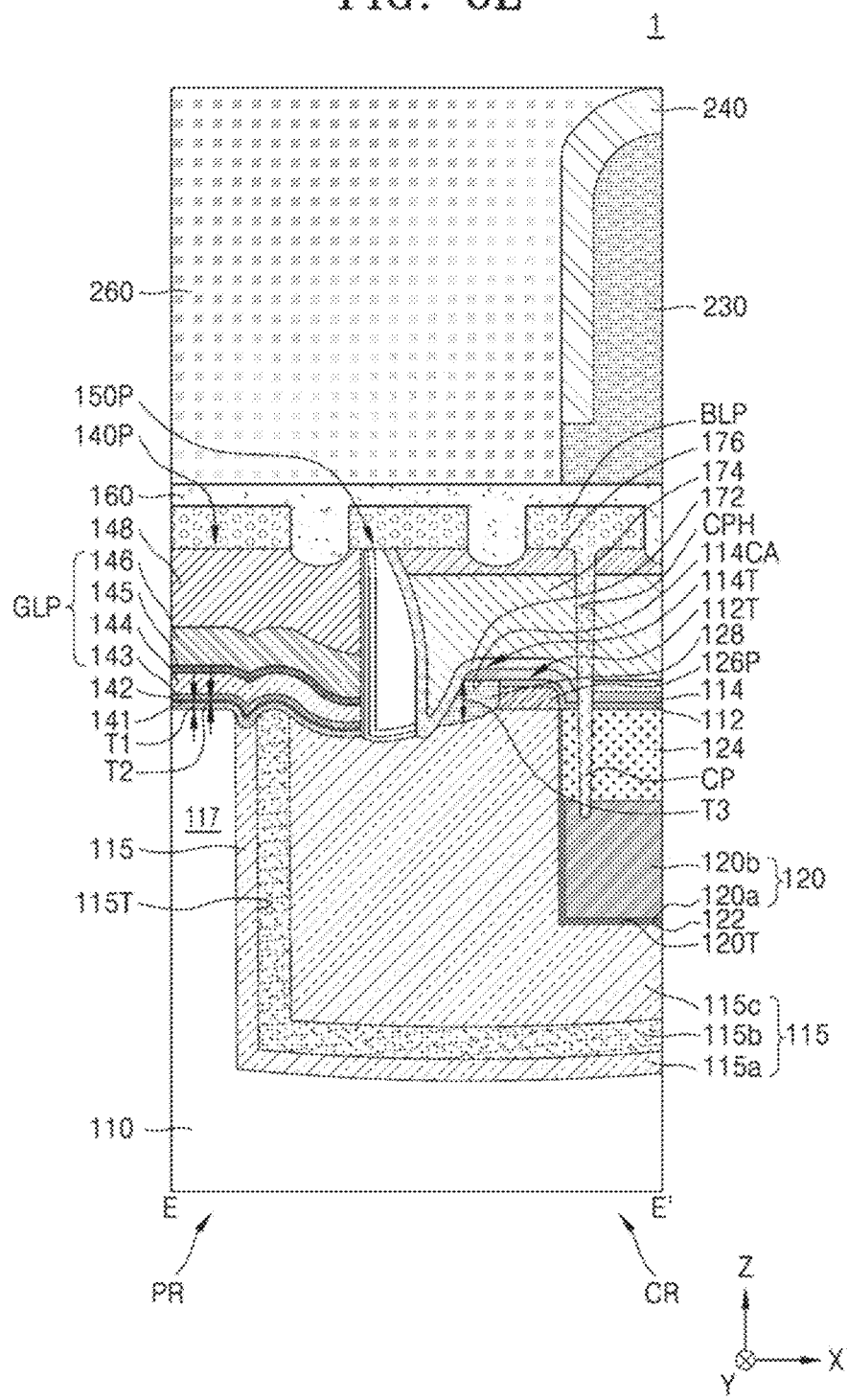
Figure 6F:
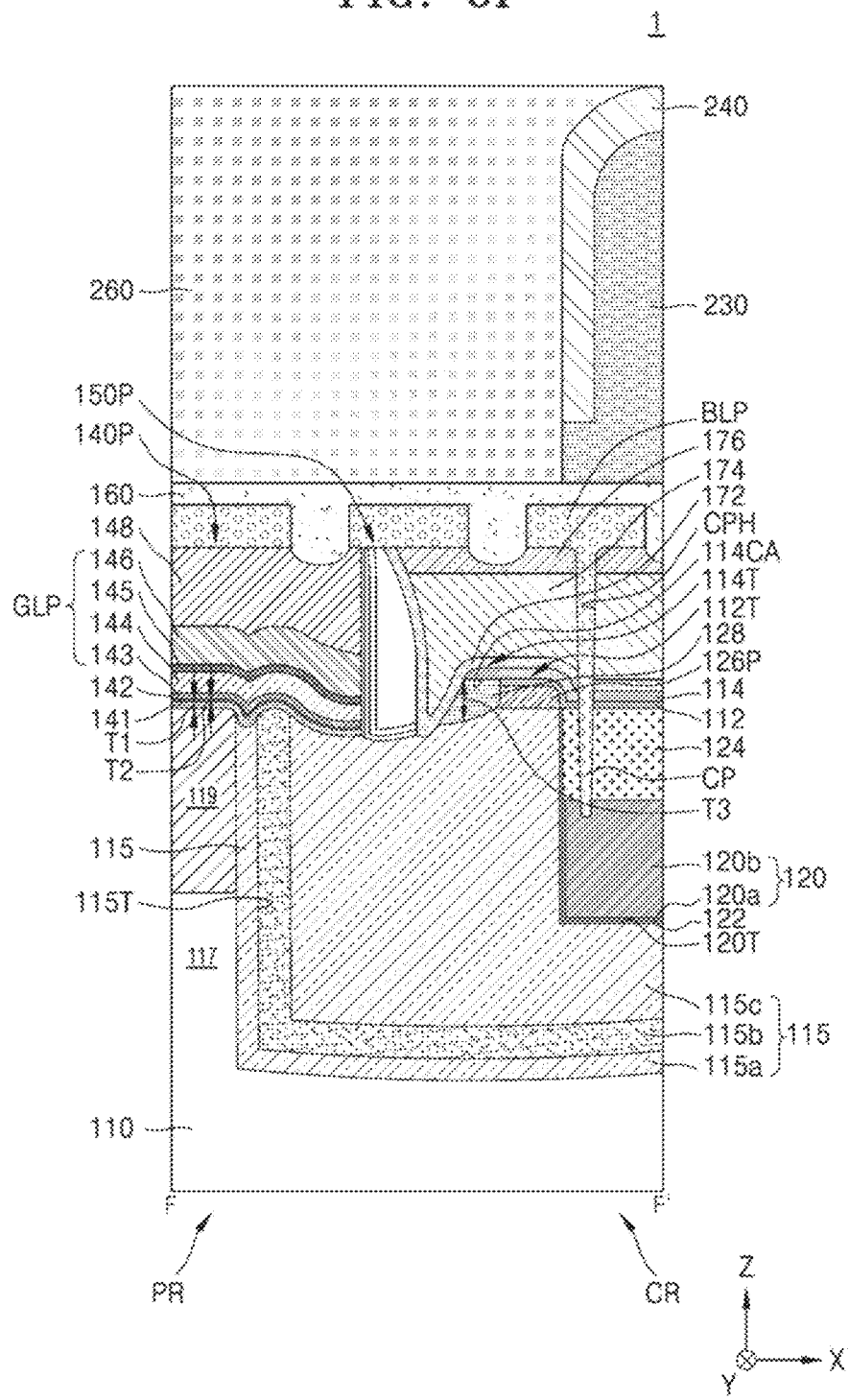
Figure 6G:
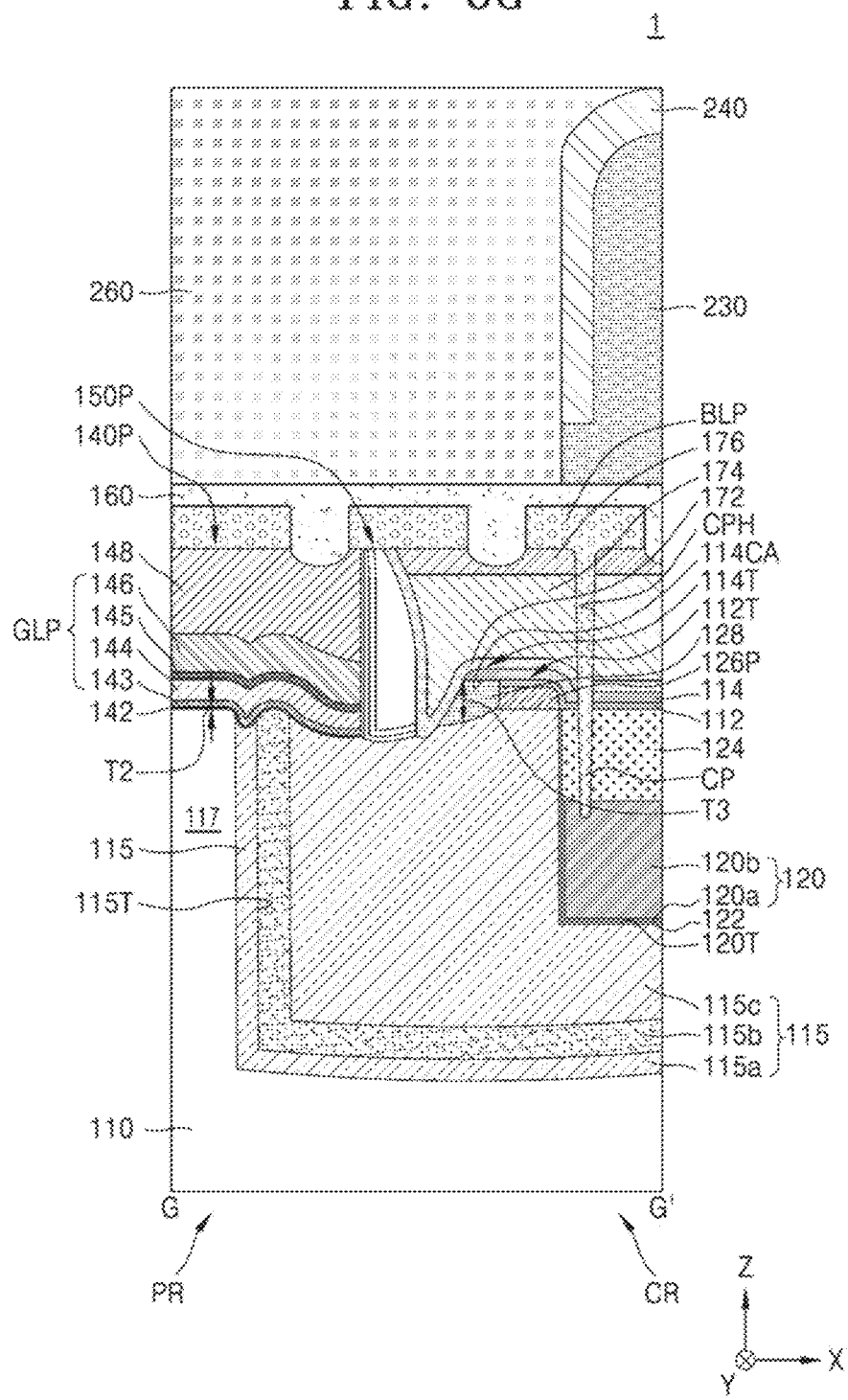
Figure 6H:
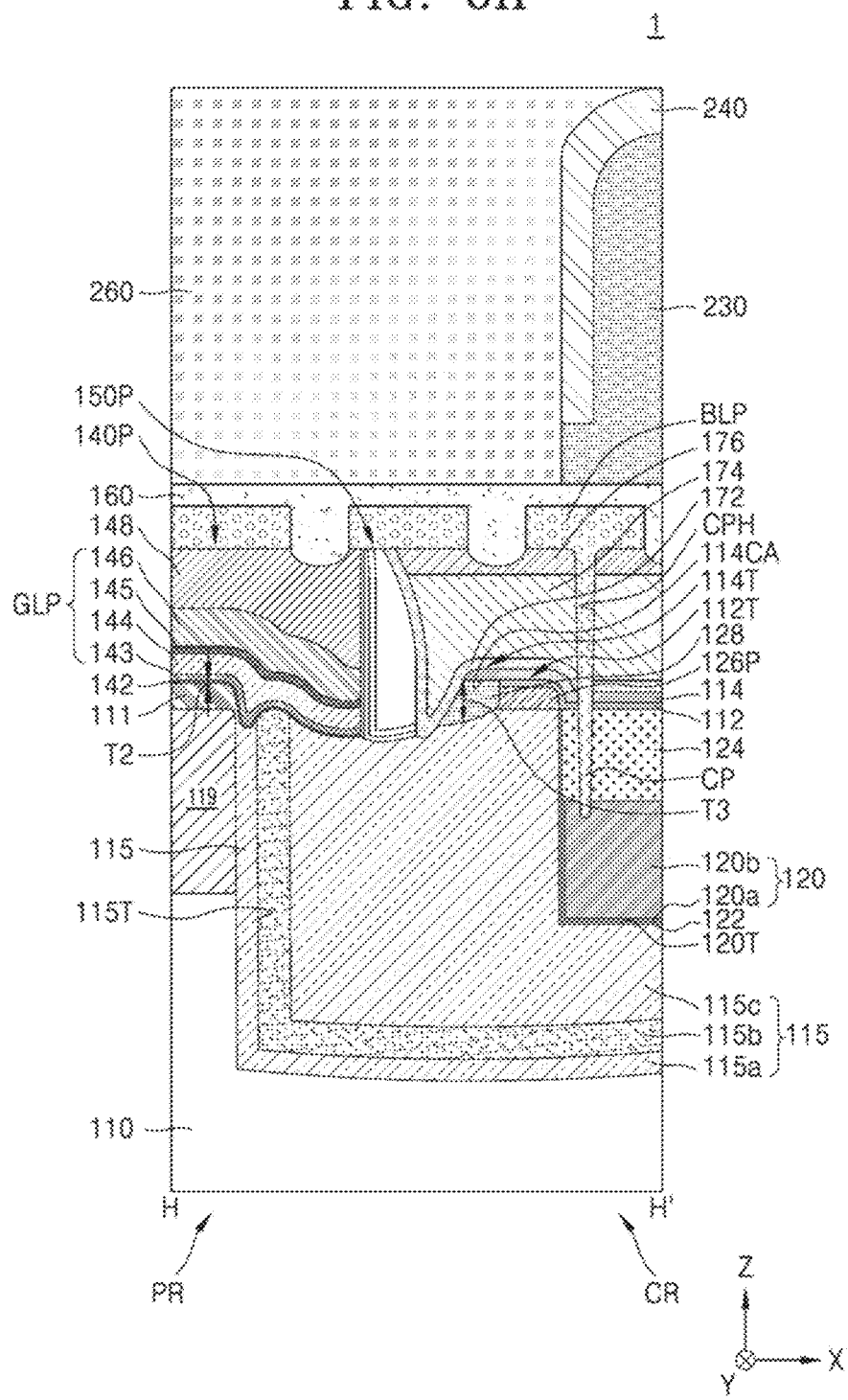

In detail, FIGS. 3A, 4A, 5A, and 6A are cross-sectional views taken along line A-A' of FIG. 2, FIGS. 3B, 4B, 5B, and 6B are cross-sectional views taken along line B-B' of FIG. 2, FIGS. 3C, 4C, 5C, and 6C are cross-sectional views taken along line C-C' of FIG. 2, FIGS. 3D, 4D, 5D, and 6D are cross-sectional views taken along line D-D' of FIG. 2, FIGS. 3E, 4E, 5E, and 6E are cross-sectional views taken along line E-E' of FIG. 2, FIGS. 4F and 6F are cross-sectional views taken along line F-F' of FIG. 2, FIGS. 4G and 6G are cross-sectional views taken along line G-G' of FIG. 2, and FIGS. 4H and 6H are cross-sectional views taken along line H-H' of FIG. 2.

Referring to FIGS. 3A to 3E together, an element isolation trench 116T and a logic element isolation trench 115T may be formed in a substrate 110, and an element isolation layer 116 filling the element isolation trench 116T and a logic element isolation layer 115 filling the logic element isolation trench 115T may be formed on the substrate 110.

In some embodiments, the substrate 110 may include, for example, silicon (Si), crystalline Si, polycrystalline Si, or amorphous Si. In some other embodiments, the substrate 110 may include a semiconductor element such as germanium (Ge), or at least one compound semiconductor selected from silicon germanium (SiGe), silicon carbide (SiC), gallium arsenide (GaAs), indium arsenide (InAs), and indium phosphide (In P). In some embodiments, the substrate 110 may have a silicon on insulator (SOI) structure. For example, the substrate 110 may include a buried oxide (BOX) layer. The substrate 110 may include a conductive region, for example, a well doped with an impurity, or a structure doped with an impurity.

A plurality of logic active regions 117 may be defined on the substrate 110 in the peripheral region (PR of FIG. 2) by the logic element isolation layer 115. The logic element isolation layer 115 is also between the memory cell region CR and the peripheral region PR to define the memory cell region CR and the peripheral region PR. For example, the logic element isolation layer 115 may be between an active region 118 of the memory cell area CR and the logic active area 117 of the peripheral area PR, which are arranged along the boundary between the memory cell area CR and the peripheral area PR. The logic element isolation layer 115 may be made of, for example, a material including at least one of silicon oxide, silicon nitride, and silicon oxynitride. In some embodiments, the logic element isolation layer 115 may be configured as a triple layer including a first logic element isolation layer 115a, a second logic element isolation layer 115b, and a third logic element isolation layer 115c sequentially stacked in the logic element isolation trench 115T, but is not limited thereto. For example, the first logic element isolation layer 115a may conformally cover the inner and bottom surfaces of the logic element isolation trench 115T. In some embodiments, the first logic element isolation layer 115a may be made of silicon oxide. For example, the second logic element isolation layer 115b may conformally cover the first logic element isolation layer 115a. In some embodiments, the second logic element isolation layer 115b may be made of silicon nitride. For example, the third logic element isolation layer 115c may cover the second logic element isolation layer 115b and fill the trench 115T for isolation of the logic device. In some embodiments, the third logic element isolation layer 115c may be made of silicon oxide. For example, the third logic element isolation layer 115c may be made of silicon oxide formed of tonen silazene TOSZ. In some embodiments, the logic element isolation layer 115 may include a single layer including one type of insulating layer, a double layer including two types of insulating layers, or a multilayer including a combination of at least 4 types of insulating layers. In some embodiments, each of the element isolation layer 116 and the logic element isolation layer 115 may include a single layer made of silicon oxide.

A plurality of active regions 118 may be defined on the substrate 110 in the memory cell region (CR of FIG. 2) by the element isolation layer 116. The element isolation layer 116 may be made of, for example, a material including at least one of silicon oxide, silicon nitride, and silicon oxynitride. The element isolation layer 116 may include a single layer including one type of insulating film, a double layer including two types of insulating films, or a multilayer including a combination of at least three types of insulating films. For example, the element isolation layer 116 may include a double layer or multiple layers made of oxide and nitride. In some embodiments, like or similar to the logic element isolation layer 115 shown in FIG. 3E, the element isolation layer 116 may include a triple layer.

In some embodiments, the element isolation layer 116 and the logic element isolation layer 115 may be formed together with each other, and may be collectively referred as an element isolation structure. The element isolation layer 116 and the logic element isolation layer 115 may not be clearly distinguished at the boundary between the cell region CR and the peripheral region PR. Accordingly, the element isolation structure may define each of the plurality of active regions 118 and the plurality of logic active regions 117, and may also be between the active region 118 of the memory cell region CR and the logic active region 117 of the peripheral region PR, which are arranged along the boundary between the memory cell area CR and the peripheral area PR.

Like the active region ACT illustrated in FIG. 2, the active region 118 may have a relatively long island shape having a short axis and a long axis in a plan view. Each of the logic active regions 117 may have a rectangular shape in a plan view, like the logic active region ACTP illustrated in FIG. 2, but this is illustrative and is not limited thereto, and may have various planar shapes.

A plurality of word line trenches 120T may be formed in the substrate 110. The plurality of word line trenches 120T may extend in a first horizontal direction (X direction) in parallel with each other, each crossing the active regions 118, and may have a line shape arranged to have substantially equal intervals in the second horizontal direction (Y direction). In some embodiments, an operation may be formed on bottom surfaces of the plurality of word line trenches 120T. In some embodiments, the plurality of word line trenches 120T may be formed by removing a portion of the substrate 110 using a mask insulating layer 126 as an etch mask.

After cleaning the resultant product in which the plurality of word line trenches 120T are formed, a plurality of gate dielectric layers 122, the plurality of word lines 120, and a plurality of buried insulating layers 124 may be sequentially formed in the plurality of word line trenches 120T. The plurality of word lines 120 may constitute a plurality of word lines WL illustrated in FIG. 2. The plurality of word lines 120 may extend in a first horizontal direction (X direction) in parallel, each crossing the active region 118, and may have a line shape arranged to have substantially equal intervals in the second horizontal direction (Y direction). The upper surface of each of the plurality of word lines 120 may be at a level lower than the upper surface of the substrate 110. Bottom surfaces of the plurality of word lines 120 may have an uneven shape, and a saddle FinFET may be formed in the plurality of active regions 118.

In the present specification, a level or a vertical level means a height in a direction (Z direction) perpendicular to a main surface or an upper surface of the substrate 110. In other words, being at the same level or at a certain level means a position at which the height in the vertical direction (Z direction) with respect to the main or upper surface of the substrate 110 is the same or constant, and being at a low/high level means a position at which the height in the vertical direction (Z direction) with respect to the main surface of the substrate 110 is low/high.

Each of the plurality of word lines 120 may fill a lower portion of the plurality of word line trenches 120T. Each of the plurality of word lines 120 may have a stacked structure of a lower word line layer 120a and an upper word line layer 120b. For example, the lower word line layer 120a may have a gate dielectric layer 122 between the lower word line layer 120a and the upper word line layer 120b, and conformally cover an inner wall and a bottom of the lower portion of the word line trench 120T. For example, the upper word line layer 120b may cover the lower word line layer 120a and fill a lower portion of the word line trench 120T. In some embodiments, the lower word line layer 120a may be made of a metal material such as Ti, TiN, Ta, or TaN, or a conductive metal nitride. In some embodiments, the upper word line layer 120b may be formed of, for example, doped polysilicon, a metal material such as W, a conductive metal nitride such as WN, TiSiN, or WSiN, or a combination thereof.

In some embodiments, before or after forming a plurality of word lines 120, a source region and a drain region may be formed in the plurality of active regions 118 by implanting impurity ions into portions of the active region 118 of the substrate 110 on both sides of the plurality of word lines 120.

The gate dielectric layer 122 may cover the inner wall and the bottom of the word line trench 120T. In some embodiments, the gate dielectric layer 122 may extend from between the word line 120 and the word line trench 120T to between the buried insulating layer 124 and the word line trench 120T. The gate dielectric layer 122 may be formed of at least one selected from silicon oxide, silicon nitride, silicon oxynitride, oxide/nitride/oxide (ONO), and a high-k dielectric material having a higher dielectric constant than silicon oxide. For example, the gate dielectric layer 122 may have a dielectric constant of about 10 to 25. In some embodiments, the gate dielectric layer 122 is made of at least one material selected from hafnium oxide (HfO), hafnium silicate (HfSiO), hafnium oxide nitride (HfON), hafnium silicon oxide nitride (HfSiON), lanthanum oxide (LaO), lanthanum aluminum oxide (LaAlO), zirconium oxide (ZrO), zirconium silicate (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 122 may be made of $HfO_2$, $Al_2O_3$, $HfAlO_3$, $Ta_2O_3$, or $TiO_2$.

The plurality of buried insulating layers 124 may fill a portion of the upper side of the plurality of word line trenches 120T. The upper surfaces of the plurality of buried insulating layers 124 may be at substantially the same level as the upper surfaces of the substrate 110. The buried insulating layer 124 may be formed of at least one material layer selected from silicon oxide, silicon nitride, silicon oxynitride, and a combination thereof. For example, the buried insulating layer 124 may be made of silicon nitride.

The mask insulating layer 126 may be disposed on an upper surface of each of the plurality of logic active regions 117 and the logic element isolation layer 115. The mask insulating layer 126 may cover all of the peripheral region (PR of FIG. 2). In some embodiments, the mask insulating layer 126 is also disposed on portion of each of upper surfaces of the plurality of active regions 118 and upper surfaces of the element isolation layers 116 in the memory cell area (CR in FIG. 2), and may be used as an etching mask for forming a plurality of word line trenches 120T. Because a portion formed in the memory cell region CR, of the mask insulating layer 126 may be removed after the plurality of word line trenches 120T are formed, the portion formed in the memory cell region CR, of the mask insulating layer 126 is not shown in FIGS. 3A to 3D. The mask insulating layer 126 may be formed of, for example, silicon oxide. In some embodiments, the mask insulating layer 126 may be made of silicon oxide formed of tetra ethyl ortho silicate (TEOS).

Referring to FIGS. 4A to 4H together, insulating layer patterns 112 and 114 covering an element isolation layer 116, a plurality of active regions 118, a plurality of buried insulating layers 124, and a mask insulating pattern 126P are formed. For example, the insulating layer patterns 112 and 114 may be formed of silicon oxide, silicon nitride, silicon oxynitride, metallic dielectric material, or a combination thereof. In some embodiments, the insulating layer patterns 112 and 114 may have a stacked structure of a plurality of insulating layers including the first insulating layer pattern 112 and the second insulating layer pattern 114. In some embodiments, the first insulating layer pattern 112 may be formed of silicon oxide, and the second insulating layer pattern 114 may be formed of silicon oxynitride. In some other embodiments, the first insulating layer pattern 112 may be formed of a non-metallic dielectric material, and the second insulating layer pattern 114 may be formed of a metallic dielectric material. In some embodiments, the second insulating layer pattern 114 may be formed thicker than the first insulating layer pattern 112. For example, the first insulating layer pattern 112 may be formed to have a thickness of about 50 Å to about 90 Å. The second insulating layer pattern 114 is thicker than the first insulating layer pattern 112 and may be formed to have a thickness of about 60 Å to about 100 Å.

Thereafter, in the memory cell region CR, after forming a conductive semiconductor layer on the insulating film patterns 112 and 114, a direct contact hole 134H is formed through the conductive semiconductor layer and the insulating layer patterns 112 and 114 to expose a source region in an active region 118, and then a conductive layer for direct contact is formed filling the direct contact hole 134H. In some embodiments, the direct contact hole 134H may extend within the active region 118, that is, into the source region. The conductive semiconductor layer may be formed of, for example, doped polysilicon. The conductive layer for direct contact may be formed of, for example, doped polysilicon. In some embodiments, the conductive layer for direct contact may be formed of an epitaxial silicon layer.

On the conductive semiconductor layer and the conductive layer for direct contact, a metallic conductive layer and an insulating capping layer for forming a bit line structure 140 are sequentially formed. In some embodiments, the metallic conductive layer may have a stacked structure in which a second metallic conductive layer is stacked on a first metallic conductive layer. By etching the first metallic conductive layer, the second metallic conductive layer, and the insulating capping layer, a plurality of bit lines 147 in which the first metallic conductive pattern 145 with a line shape and the second metallic conductive pattern 146 with a line shape are stacked, and a plurality of insulating capping lines 148 are formed.

In some embodiments, the first metallic conductive pattern 145 may be made of titanium nitride (TiN) or TSN (Ti—Si—N), and the second metallic conductive pattern 146 may be made of tungsten (W), or tungsten silicide (WSi$_x$). In some embodiments, the first metallic conductive pattern 145 may function as a diffusion barrier. In some embodiments, the plurality of insulating capping lines 148 may be made of silicon nitride.

One bit line 147 and one insulating capping line 148 covering the bit line 147 may constitute one bit line structure 140. The plurality of bit line structures 140 each including a bit line 147 and an insulating capping line 148 covering the bit line 147 may extend in a second horizontal direction (Y direction) parallel to the main surface of the substrate 110 in parallel with each other. The plurality of bit lines 147 may constitute a plurality of bit lines BL illustrated in FIG. 2. In some embodiments, the bit line structure 140 may further include a conductive semiconductor pattern 132, which is a portion of the conductive semiconductor layer between the insulating layer patterns 112 and 114 and the first metallic conductive pattern 145.

In the etching process for forming the plurality of bit lines 147, a plurality of conductive semiconductor patterns 132 and a plurality of direct contact conductive patterns 134 may be formed by removing a portion of the conductive semiconductor layer that does not vertically overlap the bit line 147 and a portion of the conductive layer for direct contact together through the etching process. In this case, the insulating layer patterns 112 and 114 may function as an etch stop layer in the etching process of forming the plurality of bit lines 147, the plurality of conductive semiconductor patterns 132, and the plurality of direct contact conductive patterns 134. The plurality of direct contact conductive patterns 134 may constitute a plurality of direct contacts DC illustrated in FIG. 2. The plurality of bit lines 147 may be electrically connected to the plurality of active regions 118 through the plurality of direct contact conductive patterns 134.

Both sidewalls of each of the plurality of bit line structures 140 may be covered with an insulating spacer structure 150. Each of a plurality of insulating spacer structures 150 may include a first insulating spacer 152, a second insulating spacer 154, and a third insulating spacer 156. The second insulating spacer 154 may be made of a material having a lower permittivity than the permittivity of the first insulating spacer 152 and the third insulating spacer 156. In some embodiments, the first insulating spacer 152 and the third insulating spacer 156 may be made of nitride, and the second insulating spacer 154 may be made of oxide. In some embodiments, the first insulating spacer 152 and the third insulating spacer 156 may be made of nitride, and the second insulating spacer 154 may be made of a material having an etch selectivity with respect to the first insulating spacer 152 and the third insulating spacer 156. For example, when the first insulating spacer 152 and the second insulating spacer 156 are made of nitride, the second insulating spacer 154 may be formed of an oxide, but may be removed in a subsequent process to become an air spacer. In some embodiments, the insulating spacer structure 150 may include the second insulating spacer 154 made of oxide and the third insulating spacer 156 made of nitride.

A plurality of insulating fences 180 are formed in a space between the plurality of insulating spacer structures 150 covering both sidewalls of each of the plurality of bit line structures 140. Among the plurality of insulating spacer structures 150 covering both sidewalls of the plurality of bit line structures 140, the plurality of insulating fences 180 may be spaced apart from each other and disposed in a row along between the pair of insulating spacer structures 150 facing each other, that is, in the second horizontal direction (Y direction). For example, the plurality of insulating fences 180 may be made of nitride. In some embodiments, the plurality of insulating fences 180 may be formed to penetrate the insulating layer patterns 112 and 114 and extend into the buried insulating layer 124, but are not limited thereto. In some other embodiments, the plurality of insulating fences 180 may be formed to penetrate the insulating layer patterns 112 and 114 but not extend into the buried insulating layer 124, or extend into the insulating layer patterns 112 and 114 but not penetrate the insulating layer patterns 112 and 114. Alternatively, the plurality of insulating fences 180 may be formed so that the lower surfaces of the plurality of insulating fences 180 are in contact with the insulating layer patterns 112 and 114 without extending into the insulating layer patterns 112 and 114.

Between each of the plurality of bit lines 147, a plurality of buried contact holes 170H may be formed between the plurality of insulating fences 180. Among the plurality of insulating spacer structures 150 covering both sidewalls of the plurality of bit line structures 140, the plurality of buried contact holes 170H and the plurality of insulating fences 180 may be alternately positioned along between the pair of insulating spacer structures 150 facing each other, that is, in the second horizontal direction (Y direction). The inner space of the plurality of buried contact holes 170H may be limited by the plurality of insulating spacer structures 150 covering sidewalls of each of the two bit lines 147 between the two neighboring bit lines 147 among the plurality of bit lines 147, the plurality of insulating fences 180, and the plurality of active regions 118.

The plurality of buried contact holes 170H may be formed by removing portions of the insulating layer patterns 112 and 114 and the active region 118 using the plurality of insulating capping lines 148, the insulating spacer structures 150 covering both sidewalls of each of the plurality of bit line structures 140, and the plurality of insulating fences 180 as an etching mask. In some embodiments, the plurality of buried contact holes 170H may be formed such that a space defined by the active region 118 is expanded, by first performing an anisotropic etching process to remove portions of the insulating layer patterns 112 and 114 and the active region 118 using the plurality of insulating capping lines 148, the insulating spacer structures 150 covering both sidewalls of each of the plurality of bit line structures 140, and the plurality of insulating fences 180 as the etching mask and then performing an isotropic etching process to further remove other portions of the active region 118.

A plurality of gate line structures 140P may be formed on the logic active region 117. The gate line structure 140P may include a gate line 147P and an insulating capping line 148 covering the gate line 147P. The plurality of gate lines 147P included in the plurality of gate line structures 140P may be formed together with the plurality of bit lines 147. The gate line 147P may have a stacked structure in which a plurality of conductive patterns are stacked. In some embodiments, the gate line 147P may have a stacked structure in which a first gate conductive pattern 143, a second gate conductive pattern 144, a first metallic conductive pattern 145, and a second metallic conductive pattern 146 are stacked. The plurality of gate lines 147P may constitute the plurality of gate line patterns GLP illustrated in FIG. 2.

For example, the first gate conductive pattern 143 may be formed of a metal material, a conductive metal nitride, a conductive metal carbide, a metallic conductor including a metal element, or a stacked structure that is a combination thereof. For example, the first gate conductive pattern 143 may include a material selected from Ti, Ta, Al, and Ni, Co, La, Pd, Nb, Mo, Hf, Ir, Ru, Pt, Yb, Dy, Er, Pd, TiAl, HfSiMo, TiN, WN, TaN, RuN, MoN, TiAlN, TaC, TiC, and groups including TaC. In some embodiments, the first gate conductive pattern 143 may function as a work function control layer for adjusting a work function of a transistor formed by the gate line 147P. For example, the first gate conductive pattern 143 may adjust a work function of each of the first transistor TRR1, the second transistor TRR2, the third transistor TRR3, and the fourth transistor TRR4 shown in FIG. 2, and materials constituting the first gate conductive pattern 143 of the gate line 147P constituting each of the first transistor TRR1, the second transistor TRR2, the third transistor TRR3, and the fourth transistor TRR4 may be selected differently depending on the work function required for each of the first transistor TRR1, the second transistor TRR2, the third transistor TRR3, and the fourth transistor TRR4.

An impurity region 119 may be formed in an upper portion of the logic active region 117 located under the gate line 147P constituting each of the second transistor TRR2 and the fourth transistor TRR4 shown in FIG. 2. When an impurity of the first conductivity type is implanted into the logic active region 117, an impurity of the second conductivity type may be implanted into the impurity region 119. In some embodiments, when the first transistor TRR1 and the third transistor TRR3 are nMOSFETs, and the second transistor TRR2 and the fourth transistor TRR4 are pMOSFETs, the impurity of the first conductivity type may be a p-type impurity and the impurity of the second conductivity type may be an n-type impurity.

In some embodiments, impurity ions may be implanted into portions of the logic active region 117 on both sides of the gate line 147P to form a logic source region and a logic drain region in the logic active region 117.

A semiconductor layer 111 may be formed on the logic active region 117 under the gate line 147P constituting the fourth transistor TRR4 shown in FIG. 2. The semiconductor layer 111 may be between the logic active region 117 and a second gate insulating layer pattern 142. The semiconductor layer 111 may be formed of a semiconductor material that is different from the logic active region 117, that is, the substrate 110. For example, the semiconductor layer 111 may be made of a Group 4 compound semiconductor material. In some embodiments, when the substrate 110 is made of silicon, the semiconductor layer 111 may be made of SiGe. In some embodiments, the semiconductor layer 111 may be formed on the logic active region 117 through epitaxial growth.

The second gate conductive pattern 144 may be formed of, for example, doped polysilicon. In some embodiments, the second gate conductive pattern 144 may be made of the same material as the conductive semiconductor pattern 132. For example, the second gate conductive pattern 144 may be a part of the conductive semiconductor layer.

In some embodiments, the first metallic conductive pattern 145 may be made of titanium nitride (TiN) or Ti—Si—N (TSN), and the second metallic conductive pattern 146 may be formed of tungsten (W), or tungsten and tungsten silicide (WSix). The first metallic conductive pattern 145 and the second metallic conductive pattern 146 are formed together with the first metallic conductive pattern 145 and the second metallic conductive pattern 146 included in the bit line 147 and may be made of the same material.

In this specification, for convenience of description, the first gate conductive pattern 143, the second gate conductive pattern 144, the first metallic conductive pattern 145, and the second metallic conductive pattern 146 of the gate line 147P may also be referred to as a first gate line pattern 143, a second gate line pattern 144, a third gate line pattern 145, and a fourth gate line pattern 146, respectively.

A gate insulating layer may be disposed between the gate line 147P and the logic active region 117. The gate insulating layer may be formed of a first gate insulating layer pattern 141 or may have a stacked structure in which the second gate insulating layer pattern 142 is stacked on the first gate insulating layer pattern 141. That is, between the gate line 147P and the logic active region 117, the first gate insulating layer pattern 141 may be positioned, or a stacked structure in which the second gate insulating layer pattern 142 is stacked on the first gate insulating layer pattern 141 may be positioned. The second gate insulating layer pattern 142 may have a higher permittivity than the first gate insulating layer pattern 141. For example, the stacked structure in which the second gate insulating layer pattern 142 is stacked on the first gate insulating layer pattern 141 may be between the gate line 147P constituting the first and second transistors TRR1 and TRR2 and the logic active region 117 shown in FIG. 2, and a second gate insulating layer pattern 142 may be between the gate line 147P constituting the third transistor TRR3 and the fourth transistor TRR4 and the logic active region 117. The first gate insulating layer pattern 141 may have a first thickness T1, and the second gate insulating layer pattern 142 may have a second thickness T2. The first thickness T1 may have a value greater than the second thickness T2. For example, the first thickness T1 may be about 60 Å to about 150 Å, and the second thickness T2 may be about 10 Å to about 40 Å. In some embodiments, an interfacial insulating layer may be further interposed under the second gate insulating layer pattern 142. The interfacial insulating layer may be made of silicon oxide.

For example, the first gate insulating layer pattern 141 may be formed of plasma nitride oxide (PNO). That is, the first gate insulating layer pattern 141 may be made of silicon oxide into which nitrogen ions are implanted by nitridating silicon oxide in a plasma environment. In some embodiments, the first gate insulating layer pattern 141 may be formed by performing a decoupled plasma nitridation (DPN) process on silicon oxide.

For example, the second gate insulating layer pattern 142 may be formed of at least one selected from silicon nitride, silicon oxynitride, and a high dielectric material having a higher dielectric constant than silicon oxide. In some embodiments, the second gate insulating layer pattern 142 may be made of at least one material selected from hafnium oxide (HfO), hafnium silicate (HfSiO), hafnium oxide nitride (HfON), hafnium silicon oxynitride (HfSiON), lanthanum oxide (LaO), lanthanum aluminum Oxide (LaAlO), zirconium oxide (ZrO), zirconium silicate (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

A sidewall of the gate line structure 140P may be covered by a gate insulating spacer 150P. The gate insulating spacer 150P may be made of, for example, a material including at least one of silicon oxide, silicon nitride, and silicon oxynitride. The gate insulating spacer 150P may include a single layer, but is not limited thereto, and may have a stacked structure of two or more layers. In some embodiments, the gate insulating spacer 150P may have a stacked structure including a first gate spacer 152P, a second gate spacer 154P, a third gate spacer 156P, and a fourth gate spacer 158P. For example, the first gate spacer 152P may be made of silicon nitride, the second gate spacer 154P may be made of silicon oxide, the third gate spacer 156P may be made of silicon nitride, and the fourth gate spacer 158P may be made of silicon oxide. In some embodiments, all or part of the gate insulating spacer 150P and all or part of the insulating spacer structure 150 may be formed together with each other and made of the same material. For example, any one of the first gate spacer 152P, the second gate spacer 154P, the third gate spacer 156P, and the fourth gate spacer 158P may be formed together with any one of the first insulating spacer 152, the second insulating spacer 154, and the third insulating spacer 154 to be made of the same material.

Meanwhile, the first insulating layer pattern 112 and the second insulating layer pattern 114 may extend from the memory cell region CR onto the logic element isolation layer 115. The first insulating layer pattern 112 and the second insulating layer pattern 114 may extend from the memory cell region CR to the logic element isolation layer 115 between the memory cell area CR and the peripheral area PR along the boundary between the memory cell area CR and the peripheral area PR. The first insulating layer pattern 112 and the second insulating layer pattern 114 may extend from the memory cell region CR toward the peripheral region PR, but do not extend to the plurality of gate line structures 140P. Thus, the first insulating layer pattern 112 and the second insulating layer pattern 114 may be spaced apart from the plurality of gate line structures 140P.

The first insulating layer pattern 112 and the second insulating layer pattern 114 may have a first extension portion 112T and a second extension portion 114T, which extend over the logic element isolation layer 115 from a plurality of active regions 118 and the buried insulating layer 124 covering the word line 120. The first extension portion 112T and the second extension portion 114T may be collectively referred to as an extension portion. That is, the insulating layer pattern 112 and 114 may have the extension portion 112T and 114T, which extends over the logic element isolation layer 115 from a plurality of active regions 118 and the buried insulating layer 124 covering the word line 120. Between each of the first and second extension portions 112T and 114T and the mask insulating pattern 126P, the mask insulating pattern 126P disposed on the logic element isolation layer 115 is positioned, and each of the first extension portion 112T and the second extension portion 114T may extend over the logic element isolation layer 115 to be spaced apart from the logic element isolation layer 115. The mask insulating pattern 126P may be formed of a material different from material of a support insulating layer 128, or may be formed of the same material as the material of the support insulating layer 128 but implanted impurity characteristics, that is, impurity types or impurity concentrations, may be different from each other. The mask insulating pattern 126P may be a part of the mask insulating layer 126 shown in FIG. 3E. The mask insulating pattern 126P may be made of silicon oxide formed of TEOS.

The first extension portion 112T may be a portion, which is spaced apart from and overhangs over the logic element isolation layer 115, of the first insulating layer pattern 112. The second extension portion 114T may be a portion, which is spaced apart from and overhangs over the logic element isolation layer 115, of the second insulating layer pattern 114. The second extension portion 114T may be spaced apart from the logic element isolation layer 115 and extend further over the logic element isolation layer 115 from the first extension portion 112T. That is, the extension length of the second extension portion 114T of the second insulating layer pattern 114, which extends from the buried insulating layer 124 covering the word line 120 over the logic element isolation layer 115, may be greater than the extension length of the first extension portion 112T of the first insulating layer pattern 112.

A recess space 114CA may be defined between a portion of the second extension portion 114T that further extends over the logic element isolation layer 115 from the first extension portion 112T and the logic element isolation layer 115. The support insulating layer 128 may be filled in the recess space 114CA. In some embodiments, a side surface of the support insulating layer 128 toward the peripheral area PR may have a shape inclined so that the lower portion is more toward the periphery (PR) than the upper portion. For example, a portion of the support insulating layer 128 may overlap with the second extension portion 114T in a vertical direction (Z direction), but the remaining portions of the support insulating layer 128 may not overlap with the second extension portion 114T. The remaining portion that does not overlap the second extension portion 114T in the vertical direction (Z direction) may be a portion closer to the peripheral area PR than a portion overlapping the second extension portion 114T in the vertical direction (Z direction) of the support insulating layer 128. The supporting insulating layer 128 may be spaced apart from the insulating spacer structure 150.

In some embodiments, the support insulating layer 128 may be formed together with the first gate insulating layer pattern 141 and may be made of the same material as the material of the first gate insulating layer. For example, the supporting insulating layer 128 may be formed of silicon oxide subjected to plasma nitridation. That is, the support insulating layer 128 may be made of silicon oxide into which nitrogen ions are implanted by nitriding silicon oxide in a plasma environment. In some embodiments, the support insulating layer 128 may be formed by performing a decoupled plasma nitridation process on the silicon oxide. The support insulating layer 128 may have a third thickness T3 greater than a first thickness T1. The third thickness T3 may have a value that is at least twice as large as the first thickness T1. For example, the third thickness T3 may be about 120 Å to about 400 Å.

The first insulating layer pattern 112 and the second insulating layer pattern 114 are formed to cover both the memory cell area CR and the peripheral area PR, and then may be formed to extend over the logic element isolation layer 115 from the buried insulating layer 124 covering the word line 120 by removing a portion covering the peripheral area PR before forming the gate line structure 140P.

In the process of removing a portion covering the peripheral region PR from among the first insulating layer pattern 112 and the second insulating layer pattern 114, a portion covering the peripheral area PR of the mask insulating layer 126 shown in FIG. 3E may be removed together. Thereafter, in the process of forming the gate line structure 140P, a portion of the mask insulating layer 126 interposed between the second extension portion 114T and the logic element isolation layer 115 and adjacent to the peripheral region PR and a portion of the first insulating layer pattern 112 may be further removed to form the mask insulating pattern 126P and the first extension portion 112T. The mask insulating pattern 126P may fill the entire space between the first extension portion 112T and the logic element isolation layer 115.

The first gate insulating layer pattern 141 may be formed by forming an insulating layer made of silicon oxide, followed by nitriding in a plasma environment, implanting nitrogen ions, and performing patterning. In this case, a portion that fills the recess space 114CA of the insulating layer made of silicon for forming the first gate insulating layer pattern 141 may remain and become the support insulating layer 128.

Because the mask insulating pattern 126P and the support insulating layer 128 fill the space between the first and second extension portions 112T and 114T, which are spaced apart from and overhanging over the logic element isolation layer 115, and the logic element isolation layer 115 to support the first and second extension portions 112T and 114T, at the edge portions of the first insulating layer pattern 112 and the second insulating layer pattern 114 facing the peripheral area PR, structural reliability of the first and second insulating layer patterns 112 and 114 may be improved.

Referring to FIGS. 5A to 5E together, a plurality of buried contacts 170 are formed in the plurality of buried contact holes 170H. The plurality of buried contacts 170 and the plurality of insulating fences 180 may be alternately positioned along between the pair of insulating spacer structures 150 facing each other among the plurality of insulating spacer structures 150 covering both sidewalls of the plurality of bit line structures 140, that is, in the second horizontal direction (Y direction). For example, the plurality of buried contacts 170 may be made of polysilicon.

In some embodiments, the plurality of buried contacts 170 may be arranged in a line in each of the first horizontal direction (X direction) and the second horizontal direction (Y direction). Each of the plurality of buried contacts 170 may extend in a vertical direction (Z direction) perpendicular to the substrate 110 from the active region 118. The plurality of buried contacts 170 may constitute the plurality of buried contacts BCs illustrated in FIG. 2.

The plurality of buried contacts 170 may be positioned in the plurality of buried contact holes 170H, which are spaces defined by the plurality of insulating fences 180 and the plurality of insulating spacer structures 150 covering both sidewalls of the plurality of bit line structures 140. The plurality of buried contacts 170 may fill a portion of a lower portion of the space between the plurality of insulating spacer structures 150 covering both sidewalls of each of the plurality of bit line structures 140.

The level of the upper surfaces of the plurality of buried contacts 170 may be positioned lower than the level of the upper surfaces of the plurality of insulating capping lines 148. The upper surfaces of the plurality of insulating fences 180 and the upper surfaces of the plurality of insulating capping lines 148 may be positioned at the same level in the vertical direction (Z direction).

A plurality of landing pad holes 190H may be defined by the plurality of buried contacts 170, the plurality of insulating spacer structures 150, and the plurality of insulating fences 180. The plurality of buried contacts 170 may be exposed on bottom surfaces of the plurality of landing pad holes 190H.

Charging insulating layers 172, 174, and 176 may be formed on the insulating layer patterns 112 and 114 around the plurality of gate line structures 140P. In some embodiments, the charging insulating layers 172, 174, and 176 may have a stacked structure in which a first charging insulating layer 172, a second charging insulating layer 174, and a third charging insulating layer 176 are stacked. The first charging insulating layer 172 may conformally cover the insulating layer patterns 112 and 114, the support insulating layer 128, and the insulating spacer structure 150. In some embodiments, the first charging insulating layer 172 may further cover the logic element isolation layer 115 exposed between the support insulating layer 128 and the gate insulating spacer 150P. In some embodiments, the first charging insulating layer 172 may be formed of nitride, the second charging insulating layer 174 may be formed of oxide, and the third charging insulating layer 176 may be formed of nitride. The upper surfaces of the charging insulating layers 172, 174, 176, that is, the upper surfaces of the third charging insulating layer 176 and the upper surfaces of the gate line structure 140P may have the same level. In some embodiments, the first charging insulating layer 172 may contact the logic element isolation layer 115.

In the process of forming the plurality of buried contacts 170, because a portion of the upper sides of the insulating capping line 148 included in the bit line structure 140 and the gate line structure 140P, the insulating spacer structure 150, and the gate insulating spacer 150P are removed, the level of the upper surfaces of the bit line structure 140 and the gate line structure 140P may be lowered.

Referring to FIGS. 6A to 6H, a plurality of contact holes CPH penetrating through the charging insulating layers 172, 174, and 176 and the insulating layer patterns 112 and 114 are formed. At least some of the plurality of contact holes CPH may be word line contact holes passing through the charging insulating layers 172, 174, 176, the insulating layer patterns 112, 114, and the buried insulating layer 124, and extending to the word line 120. Although not shown separately, others of the plurality of contact holes CPH may be logic active region contact holes passing through the charging insulating layers 172, 174, and 176, and the insulating layer patterns 112 and 114, and extending to the logic active region 117, and others of the plurality of contact holes CPH may pass through the insulating capping line 148 and extend to the second metallic conductive pattern 146 or the first metallic conductive pattern 145 constituting the gate line 147P or the bit line 147.

Thereafter, after the plurality of landing pad holes (190H in FIGS. 5A and 5C) and the plurality of contact holes CPH are filled, and a landing pad material layer covering the plurality of bit line structures 140 and the plurality of gate line structures 140P is formed, a portion of the landing pad material layer may be removed to form a recess portion 190R. A plurality of landing pads 190 separated by a plurality of recesses 190R, a plurality of logic bit lines BLP, and a plurality of contact plugs CP filling the plurality of contact holes CPH may be formed. The plurality of landing pads 190 may fill at least a portion of the plurality of landing pad holes 190H and extend onto the plurality of bit line structures 140.

In some embodiments, the landing pad material layer may be formed of a conductive barrier layer and a conductive pad material layer on the conductive barrier layer. For example, the conductive barrier layer may be formed of a metal, a conductive metal nitride, or a combination thereof. In some embodiments, the conductive barrier layer may be formed of a Ti/TiN stacked structure. In some embodiments, the conductive pad material layer may include tungsten (W).

In some embodiments, a metal silicide layer may be formed on the plurality of buried contacts 170 before forming the landing pad material layer. The metal silicide layer may be between the plurality of buried contacts 170 and the landing pad material layer. The metal silicide layer may be formed of cobalt silicide ($CoSi_x$), nickel silicide ($NiSi_x$), or manganese silicide ($MnSi_x$), but is not limited thereto.

The plurality of landing pads 190 may be spaced apart from each other with the recess portion 190R interposed therebetween. The plurality of landing pads 190 are disposed on the plurality of buried contacts 170 and may extend onto the plurality of bit line structures 140. In some embodiments, the plurality of landing pads 190 may extend onto the plurality of bit lines 147. The plurality of landing pads 190 may be on the plurality of buried contacts 170, so that the plurality of buried contacts 170 and the plurality of landing pads 190 corresponding to each other may be electrically connected. The plurality of landing pads 190 may be connected to the active region 118 through the plurality of buried contacts 170. The plurality of landing pads 190 may constitute the plurality of landing pads LP illustrated in FIG. 2.

The buried contact 170 may be between two bit line structures 140 adjacent to each other, and the landing pad 190 may extend onto one bit line structure 140 from between two bit line structures 140 adjacent to each other with the buried contact 170 between the two bit line structures 140.

A logic bit line BLP may be a portion of the landing pad material layer positioned on the charging insulating layers 172, 174, and 176.

The recessed part 190R may be filled by an insulating structure 195. In some embodiments, the insulating structure 195 may be formed of an interlayer insulating layer and an etch stop layer. For example, the interlayer insulating layer may be made of oxide, and the etch stop layer may be made of nitride. Referring to FIGS. 6A and 6C, an upper surface of the insulating structure 195 is illustrated to be positioned at the same level as an upper surfaces of the plurality of landing pads 190, but are not limited thereto. For example, the insulating structure 195 may have an upper surface positioned at a level higher than that of the plurality of landing pads 190 by filling the recess portion 190R and covering the upper surfaces of the plurality of landing pads 190. Referring to FIGS. 6A and 6C, the upper surface of the insulating structure 195 is illustrated to be positioned at the same level as a lower surface of the lower electrode 210, but is not limited thereto.

A plurality of lower electrodes 210, a capacitor dielectric layer 220, and an upper electrode 230 are sequentially formed on the plurality of landing pads 190. The plurality of lower electrodes 210, the capacitor dielectric layer 220, and the upper electrode 230 may form a plurality of capacitor structures 200. Each of the plurality of lower electrodes 210 may be electrically connected to each of the plurality of landing pads 190. The capacitor dielectric layer 220 may conformally cover the surfaces of the plurality of lower electrodes 210. In some embodiments, the capacitor dielectric layer 220 may be integrally formed to cover the plurality of lower electrodes 210 together in a certain region, for example, one memory cell region (CR in FIG. 2). In some other embodiments, the capacitor dielectric layer 220 may be formed to cover the memory cell region CR and the peripheral region (PR of FIG. 2) together. The plurality of lower electrodes 210 may constitute the plurality of storage nodes SN illustrated in FIG. 2. In some embodiments, the capacitor dielectric layer 220 may be formed only in the memory cell region CR.

Before filling the lower electrode 210 and the capacitor dielectric layer 220, a logic capping layer 160 covering the plurality of logic bit lines BLP may be formed. The logic capping layer 160 may be made of, for example, silicon nitride. In some embodiments, the logic capping layer 160 may be formed to cover upper surfaces of the plurality of logic bit lines BLP. In some other embodiments, because the logic capping layer 160 fills the space between each of the plurality of logic bit lines BLP but does not cover the upper surface of the plurality of logic bit lines BLP, the logic capping layer 160 may be formed to have an upper surface of the same level as the plurality of logic bit lines BLP. In some embodiments, the logic capping layer 160 and the insulating structure 195 may be formed of the same material together and have upper surfaces of the same level. For example, the upper surface of each of the logic capping layer 160 and the insulating structure 195 may be positioned at the same level as the upper surface of each of the plurality of landing pads 190 and the plurality of logic bit lines BLP. Or, for example, the upper surface of each of the logic capping layer 160 and the insulating structure 195 may be positioned at the same level with each other at a level higher than that of the plurality of landing pads 190 and the plurality of logic bit lines BLP. In some other embodiments, the logic capping layer 160 may be formed only in the peripheral area PR through a separate process from the insulating structure 195, or may be formed only in a portion of the memory cell area CR adjacent to the peripheral area PR and the peripheral area PR. For example, the upper surface of the logic capping layer 160 may be positioned at a higher level than the upper surface of the insulating structure 195. Alternatively, for example, the upper surface of the logic capping layer 160 may be positioned at a lower level than the upper surface of the insulating structure 195.

Each of the plurality of lower electrodes 210 may have a pillar shape filled with the inside so as to have a circular horizontal cross section, that is, a pillar shape, but is not limited thereto. In some embodiments, each of the plurality of lower electrodes 210 may have a cylinder shape with a lower portion closed. In some embodiments, the plurality of lower electrodes 210 may be arranged in a honeycomb shape arranged in a zigzag with respect to a first horizontal direction (X direction) or a second horizontal direction (Y direction). In some other embodiments, the plurality of lower electrodes 210 may be arranged in a matrix form arranged in a line in each of the first horizontal direction (X direction) and the second horizontal direction (Y direction). The plurality of lower electrodes 210 may be made of, for example, a metal such as silicon, tungsten, or copper doped with impurities, or a conductive metal compound such as titanium nitride. Although not shown separately, the semiconductor memory device 1 may further include at least one support pattern in contact with sidewalls of the plurality of lower electrodes 210.

The capacitor dielectric layer 220 may be formed of, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 230 may have one of a doped semiconductor material layer, a main electrode layer, and an interface layer, or may have stacked structure in which at least two of the doped semiconductor material layer, the main electrode layer, and the interface layer are stacked. The doped semiconductor material layer may include, for example, at least one of doped polysilicon and doped polycrystalline silicon germanium (SiGe). The main electrode layer may be made of a metallic material. The main electrode layer may be made of, for example, W, Ru, RuO, Pt, PtO, Ir, IrO, SRO(SrRuO), BSRO((Ba,Sr)RuO), CRO (CaRuO), BaRuO, La(Sr,Co)O, etc. In some embodiments, the main electrode layer may be formed of W. The interface layer may include at least one of a metal oxide, a metal nitride, a metal carbide, and a metal silicide.

An etch stop layer 240 may be formed on the upper electrode 230. The etch stop layer 240 may be formed of, for example, a combination of Si and at least one of O, N, C, B, H, and F, or a combination of Ge and at least one of O, N, C, B, H, and F. The etch stop layer 240 may be formed of, for example, SiO, SiN, SiCN, SiON, SiBN, SiGe, or the like. In some embodiments, the etch stop layer 240 may be made of silicon oxynitride or silicon nitride. Thereafter, a portion of the upper electrode 230 covering the peripheral region PR and a portion of the etch stop layer 240 are removed, and then a buried insulating layer 260 covering the logic capping layer 160 is formed. The upper surfaces of the buried insulating layer 260 and the etch stop layer 240 may be at substantially the same vertical level. For example, after the buried insulating material layer covering the logic capping layer 160 and the etch stop layer 240 is formed, by removing an upper portion of the buried insulating material layer by performing a CMP process using the etch stop layer 240 as a process stopper, a buried insulating layer 260 may be formed. The buried insulating layer 260 may be formed of, for example, silicon oxide. The buried insulating layer 260 may be formed of, for example, an oxide or an ultra low K (ULK) film. The oxide may be formed of any one selected from borophosphosilicate glass (BPSG) film, phosphosilicate glass (PSG) film, borosilicate glass (BSG) film, undoped silicate glass (USG) film, tetra ethyl ortho silicate (TEOS) film, and high density plasma (HDP) film. The ULK film may be formed of, for example, any one selected from a SiOC film and a SiCOH film having an ultra low dielectric constant K of 2.2 to 2.4.

The semiconductor memory device 1 may further include the element isolation layer 116, the plurality of active regions 118, the plurality of buried insulating layers 124, and the stacked structure in which the first insulating layer pattern 112 and the second insulating layer pattern 114 covering the mask insulating layer 126P are stacked. The first insulating layer pattern 112 and the second insulating layer pattern 114 include a first extension portion 112T and a second extension portion 112T extending over the logic element isolation layer 115 from the buried insulating layer 124 covering the word line 120. Each of the first extension portion 112T and the second extension portion 114T has a mask insulating pattern 126P positioned on the logic element isolation layer 115 therebetween and extends over the logic element isolation layer 115 to be spaced apart from the logic element isolation layer 115.

The recess space 114CA may be defined between a portion further extending over the logic element isolation layer 115 from the first extension portion 112T of the second extension portion 114T, and the logic element isolation layer 115. The support insulating layer 128 may be filled in the recess space 114CA. In some embodiments, a side surface of the support insulating layer 128 toward the peripheral area PR may have a shape inclined so that the lower portion is more toward the periphery (PR) than the upper portion. The supporting insulating layer 128 may be spaced apart from the insulating spacer structure 150. In some embodiments, the support insulating layer 128 may be formed together with the first gate insulating layer pattern 141 and may be made of the same material. For example, the support insulating layer 128 may be made of silicon oxide implanted with nitrogen ions. The support insulating layer 128 may have a third thickness T3 greater than the first thickness T1.

Because the mask insulating pattern 126P and the support insulating layer 128 fill the space between the first and second extension portions 112T and 114T that are spaced apart from and overhanging over the logic element isolation layer 115 and the logic element isolation layer 115 at the edge portions of the first insulating layer pattern 112 and the second insulating layer pattern 114 facing the peripheral area PR, structural reliability of the first insulating layer pattern 112 and the second insulating layer pattern 114 may be improved. Accordingly, the semiconductor memory device 1 according to inventive concepts may have structural reliability.

While embodiments of inventive concepts have been particularly shown and described with reference to embodiments thereof, it will be understood that various changes in form and details may be made therein without departing from the spirit and scope of the following claims.

What is claimed is:

1. A semiconductor memory device comprising:
a substrate including a memory cell region, an active region in the memory cell region, a peripheral region, and a logic active region in the peripheral region;
an element isolation structure between the active region and the logic active region, the element isolation structure defining the active region and the logic active region;
an insulating layer pattern covering the active region, the insulating layer pattern including an extension portion that extends along the element isolation structure, is spaced apart from the element isolation structure, and overhangs over the element isolation structure, and the insulating layer pattern including a stacked structure in which a second insulating layer pattern having a second extension portion is on a first insulating layer pattern having a first extension portion; and
a support insulating layer filling a recess space defined between the extension portion and the element isolation structure, wherein
a portion of the element isolation structure bordering the support insulating layer has a non-flat surface, wherein
an extension length of the second extension portion is greater than an extension length of the first extension portion.

2. The semiconductor memory device of claim 1, wherein the support insulating layer includes silicon oxide implanted with nitrogen ions.

3. The semiconductor memory device of claim 1, wherein a thickness of the second insulating layer pattern is greater than a thickness of the first insulating layer pattern.

4. The semiconductor memory device of claim 1, further comprising:
a mask insulating pattern between the first extension portion and the element isolation structure, wherein the support insulating layer fills the recess space defined between the element isolation structure and a portion of the second extension portion further extending from the first extension portion over the element isolation structure, and the mask insulating pattern includes a material having a different impurity type or impurity concentration than an impurity or impurity concentration included in the support insulating layer.

5. The semiconductor memory device of claim 1, further comprising:

a transistor including a gate insulating layer and a gate line on the logic active region, wherein a material in the support insulating layer is the same as a material in at least a portion of the gate insulating layer.

6. The semiconductor memory device of claim 5, wherein the gate insulating layer has a stacked structure in which a second gate insulating layer pattern is on a first gate insulating layer pattern, the first gate insulating layer pattern has a first thickness, the second gate insulating layer pattern has a second thickness, the second thickness is less than the first thickness, and a material in the support insulating layer is the same as a material in the first gate insulating layer pattern.

7. The semiconductor memory device of claim 6, wherein a permittivity of the second gate insulating layer pattern is higher than a permittivity of the first gate insulating layer pattern.

8. The semiconductor memory device of claim 6, wherein the support insulating layer has a third thickness, the third thickness is at least twice or greater than the first thickness of the first gate insulating layer pattern.

9. A semiconductor memory device comprising:

a substrate including a memory cell region, an active region in the memory cell region, a peripheral region, and a logic active region in the peripheral region;

an element isolation structure between the active region and the logic active region, the element isolation structure defining the active region and the logic active region;

an insulating layer pattern covering the active region, the insulating layer pattern having a stacked structure in which a second insulating layer pattern is on a first insulating layer pattern extending over the element isolation structure between the active region and the logic active region; and a support insulating layer between the insulating layer pattern and the element isolation structure, wherein the first insulating layer pattern includes a first extension portion, the second insulating layer pattern includes a second extension portion, an extension length of the second extension portion is greater than an extension length of the first extension portion, each of the first extension portion and the second extension portion extend along the element isolation structure, are spaced apart from the element isolation structure, and overhang over the element isolation structure, and the support insulating layer fills a recess space defined between the element isolation structure and a portion of the second extension portion extends over the element isolation structure from the first extension portion.

10. The semiconductor memory device of claim 9, further comprising:

a first transistor on the logic active region, the first transistor including a gate insulating layer having a stacked structure and a gate line on the gate insulating layer, the stacked structure including a second gate insulating layer pattern on a first gate insulating layer pattern, the second gate insulating layer pattern having a second thickness and a second permittivity, the first gate insulating layer pattern having a first thickness and a first permittivity, the second thickness being less than the first thickness, and the second permittivity of the second gate insulating layer pattern being greater than first permittivity of the first gate insulating layer pattern, wherein a material included in the support insulating layer is the same as a material included in the first gate insulating layer pattern.

11. The semiconductor memory device of claim 10, wherein the support insulating layer has a third thickness that is at least twice as large as the first thickness of the first gate insulating layer pattern.

12. The semiconductor memory device of claim 10, further comprising:

a second transistor on the logic active region, wherein the second transistor includes the second gate insulating layer pattern and a gate line on the second gate insulating layer pattern.

13. The semiconductor memory device of claim 9, wherein the support insulating layer includes silicon oxide implanted with nitrogen ions.

14. The semiconductor memory device of claim 9, further comprising:

a mask insulating pattern between the first extension portion and the element isolation structure, wherein the mask insulating pattern is closer to the active region than the support insulating layer, and the mask insulating pattern includes silicon oxide having a different impurity type or impurity concentration than an impurity type or impurity concentration in the support insulating layer.

15. The semiconductor memory device of claim 9, further comprising:

a gate dielectric layer, a word line, and a buried insulating layer sequentially disposed in a word line trench extending across the active region in the memory cell region, wherein the insulating layer pattern covers the active region and the buried insulating layer together.

16. A semiconductor memory device comprising:

a substrate including a memory cell region, a plurality of active regions in the memory cell region, a peripheral region, and a plurality of logic active regions in the peripheral region, the substrate defining a plurality of word line trenches extending in parallel with each other in a horizontal direction across the plurality of active regions in the memory cell region;

an element isolation structure between the plurality of active regions and the plurality of logic active regions and along between the memory cell region and the peripheral region, the element isolation structure defining the plurality of active regions and the plurality of logic active regions;

a gate dielectric layer, a word line, and a buried insulating layer sequentially positioned in each of the plurality of word line trenches;

an insulating layer pattern covering the plurality of active regions and the buried insulating layer, the insulating layer pattern extending over the element isolation structure between the memory cell region and the peripheral region, and the insulating layer pattern including a first insulating layer pattern and a second insulating layer pattern on the first insulating layer pattern;

a transistor on the logic active region, the transistor including a gate insulating layer and a gate line on the gate insulating layer, the gate insulating layer having a stacked structure of a first gate insulating layer pattern having a first thickness and a second gate insulating layer pattern having a second thickness; and a support insulating layer between the insulating layer pattern and the element isolation structure, wherein the first insulating layer pattern includes a first extension portion, the second insulating layer pattern includes a second extension portion, an extension length of the second extension portion is greater than an extension length of the first extension portion, each of the first extension portion and the second extension portion extend along the element isolation structure from over the plurality of active regions and the buried insulating layer, are spaced apart from the element isolation structure, and overhang over the element isolation structure, the support insulating layer fills a recess space defined between the element isolation structure and a portion of the second extension portion further extending from the first extension portion over the element isolation structure, a material in the support insulating layer is the same material as a material in the first gate insulating layer pattern, and the support insulating layer has a third thickness that is at least twice as large as the first thickness of the first gate insulating layer pattern.

17. The semiconductor memory device of claim 16, wherein the third thickness of the support insulating layer is 120 Å to 400 Å.

18. The semiconductor memory device of claim 16, wherein the first gate insulating layer pattern and the support insulating layer include silicon oxide implanted with nitrogen ions.

* * * * *